(12) United States Patent
Kwon et al.

(10) Patent No.: US 7,521,348 B2
(45) Date of Patent: Apr. 21, 2009

(54) METHOD OF FABRICATING SEMICONDUCTOR DEVICE HAVING FINE CONTACT HOLES

(75) Inventors: Sung-Hyun Kwon, Seoul (KR);
Jae-Hwang Sim, Seoul (KR);
Dong-Hwa Kwak, Gyeonggi-do (KR);
Joo-Young Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/871,877

(22) Filed: Oct. 12, 2007

(65) Prior Publication Data

US 2008/0096391 A1   Apr. 24, 2008

(30) Foreign Application Priority Data

Oct. 23, 2006  (KR) ..................... 10-2006-0103093
Apr. 3, 2007   (KR) ..................... 10-2007-0032826

(51) Int. Cl.
*H01L 21/44* (2006.01)
(52) U.S. Cl. ................. 438/597; 438/586; 438/633; 438/634; 438/638; 438/639; 438/669; 438/672; 438/681; 257/E21.038; 257/E21.235
(58) Field of Classification Search ........... None
See application file for complete search history.

(56) References Cited

U.S. PATENT DOCUMENTS

2006/0046407 A1* 3/2006 Juengling ............... 438/301

FOREIGN PATENT DOCUMENTS

| JP | 57-48237 | 3/1982 |
|---|---|---|
| KR | 1997-0004070 | 1/1997 |
| KR | 2000-0045425 | 7/2000 |
| KR | 10-2005-0072877 | 7/2005 |

OTHER PUBLICATIONS

English language abstract of Japanese Publication No. 57-48237, Mar. 19, 1982.
English language abstract of Korean Publication No. 2000-0045425, Jul. 15, 2000.
English language abstract of Korean Publication No. 10-2005-0072877, Jul. 12, 2005.

* cited by examiner

*Primary Examiner*—N Drew Richards
*Assistant Examiner*—Kyoung Lee
(74) *Attorney, Agent, or Firm*—Marger Johnson & McCollom, P.C.

(57) ABSTRACT

A method for fabricating a semiconductor device having fine contact holes is exemplarily disclosed. The method includes forming an isolation layer defining active regions on a semiconductor substrate. An interlayer dielectric layer is formed on the semiconductor substrate having the isolation layer. First molding patterns are formed on the interlayer dielectric layer. Second molding patterns positioned between the first molding patterns and spaced apart therefrom are also formed. A mask pattern surrounding sidewalls of the first and second molding patterns is formed. Openings are formed by removing the first and second molding patterns. Contact holes are formed by etching the interlayer dielectric layer using the mask pattern as an etching mask.

23 Claims, 37 Drawing Sheets

METHOD OF FABRICATING SEMICONDUCTOR DEVICE HAVING FINE CONTACT HOLES

CROSS-REFERENCE TO RELATED APPLICATION

This application claims the benefit of foreign priority under 35 U.S.C. § 119 to Korean Patent Application No. 10-2006-0103093, filed on Oct. 23, 2006, and to Korean Patent Application No. 10-2007-0032826, filed on Apr. 3, 2007, the disclosures of each of which are hereby incorporated by reference herein as if set forth in their entirety.

BACKGROUND

1. Technical Field

Embodiments of the present invention generally relate to methods of fabricating semiconductor devices, and more particularly, to a method of fabricating a semiconductor device wherein fine contact holes are formed using a mask pattern formed using molding patterns.

2. Discussion of the Related Art

A semiconductor device includes discrete devices such as transistors, resistors and capacitors. The discrete devices are electrically connected to one another through contact plugs or interconnections, formed in contact holes passing through an insulating layer. For example, a NAND-type flash memory device may include word lines crossing above active regions spaced apart from one another inside a semiconductor substrate, and a selection line adjacent to the word lines and crossing above the active regions. The NAND-type flash memory device may also include bit lines insulated from the word and selection lines by an interlayer dielectric layer and crossing above them. The bit lines may be electrically connected to the active regions adjacent to the select line through the contact holes, respectively. The contact holes may be generally formed through a patterning process. The patterning process includes forming a mask pattern having hole-shaped openings on the interlayer dielectric layer through a photo-process and etching the interlayer dielectric layer exposed through the openings.

Because the size of the contact holes becomes smaller as the integration density of the semiconductor device increases, the size of the openings should be reduced. However, it is difficult to control the photo-process as it is required to reduce the size of the openings. For example, as the topology on the semiconductor substrate is complicated, diffuse reflections may be generated due to patterns, such as the selection and word lines, during the photo-process. Therefore, there is a limit in ensuring the uniform size of each of the openings. As a result, a uniform resistance is not secured in a contact plug filling each of the contact holes. Therefore, the reliability of a semiconductor device is degraded.

SUMMARY

Therefore, embodiments exemplary described herein are directed to provide a method of fabricating a semiconductor device having contact holes with a fine and substantially uniform size by forming a mask pattern using molding patterns.

One embodiment exemplary described herein can be characterized as a method of fabricating a semiconductor device. The method may, for example, include forming an isolation layer defining active regions on a semiconductor substrate. An interlayer dielectric layer may be formed on the semiconductor substrate having the isolation layer. First molding patterns may be formed on the interlayer dielectric layer. Second molding patterns positioned between the first molding patterns and spaced apart therefrom may also be formed. A mask pattern surrounding sidewalls of the first and second molding patterns may be formed. Openings may be formed by removing the first and second molding patterns. Contact holes are formed by etching the interlayer dielectric layer using the mask pattern as an etching mask.

BRIEF DESCRIPTION OF THE DRAWINGS

The above and other features of the embodiments exemplary described above will become more apparent to those of ordinary skill in the art by describing in detail preferred embodiments thereof with reference to the attached drawings in which.

DETAILED DESCRIPTION

Figure 1:
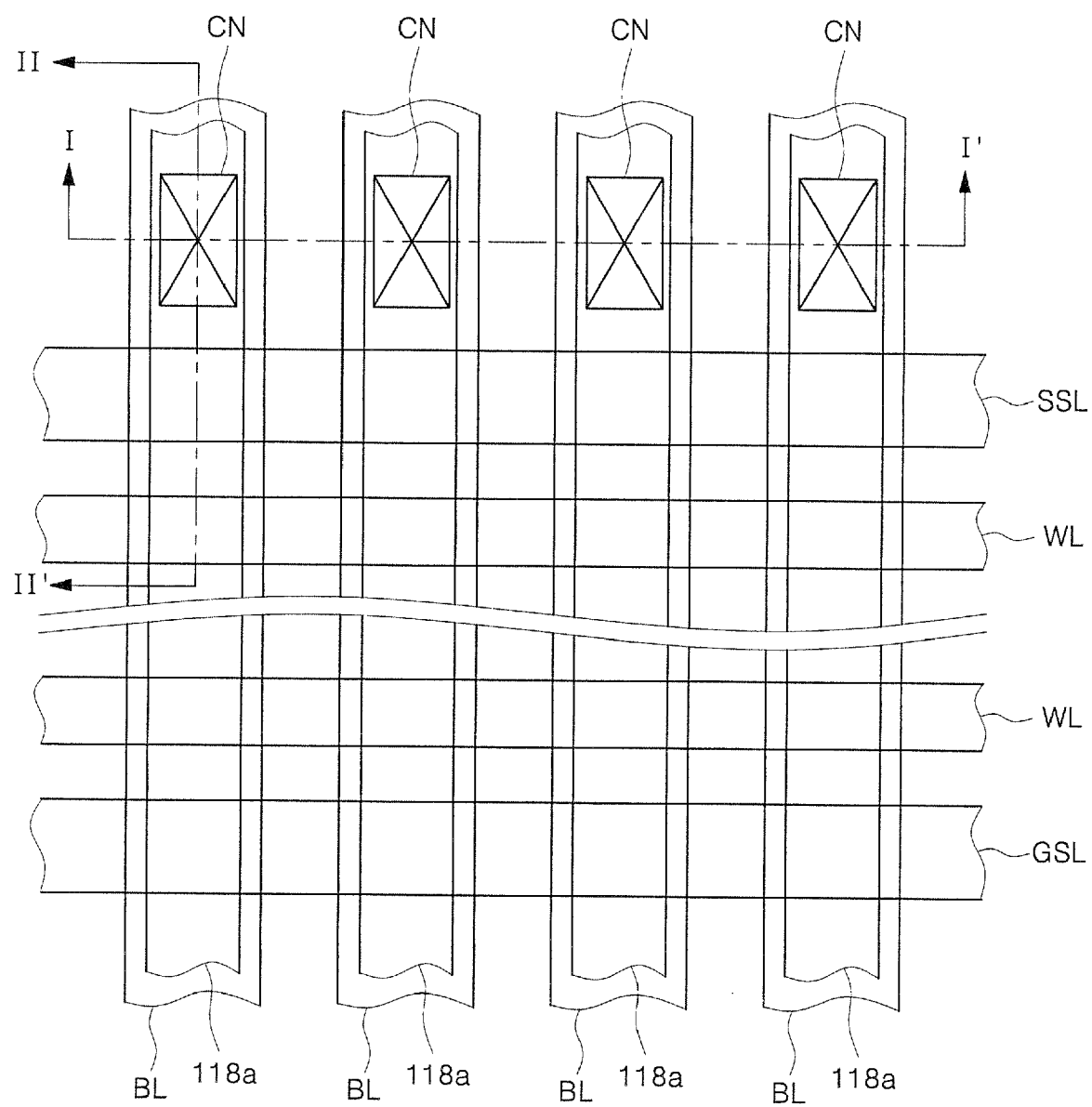
FIG. 1 is a plan view of a semiconductor device according to one exemplary embodiment.

Exemplary embodiments of the present invention will now be described more fully hereinafter with reference to the accompanying drawings. These embodiments may, however, be realized in many different forms and should not be construed as being limited to the embodiments expressly set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification. It will be understood that when an element such as a layer, film, region or substrate is referred to as being "on" another element, it can be directly on the other element or intervening elements may also be present. In contrast, when an element is referred to as being "directly on" another element, there are no intervening elements present.

FIG. 1 is a plan view of a semiconductor device according to one exemplary embodiment. FIGS. 2A, 3A, 4A, 5A, 6A, 7A, 8A, 9A, 10A, 11A, 12A, 13A and 14A are cross-sectional views taken along line I-I' of FIG. 1, illustrating an exemplary method of fabricating a semiconductor device according to a first embodiment. FIGS. 2B, 3B, 4B, 5B, 6B, 7B, 8B, 9B, 10B, 11B, 12B, 13B and 14B are cross-sectional views taken along line II-II' of FIG. 1, illustrating an exemplary method of fabricating a semiconductor device according to the first embodiment.

Figure 2A:
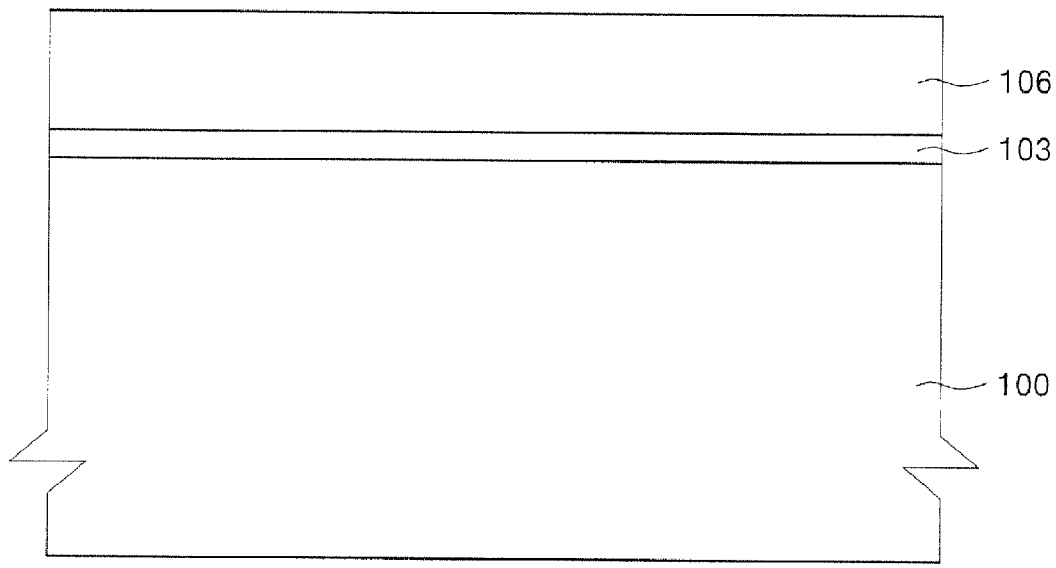
FIGS. 2A, 3A, 4A, 5A, 6A, 7A, 8A, 9A, 10A, 11A, 12A, 13A and 14A are cross-sectional views taken along line I-I' of FIG. 1, illustrating an exemplary method of fabricating a semiconductor device according to a first embodiment.
Figure 2B:
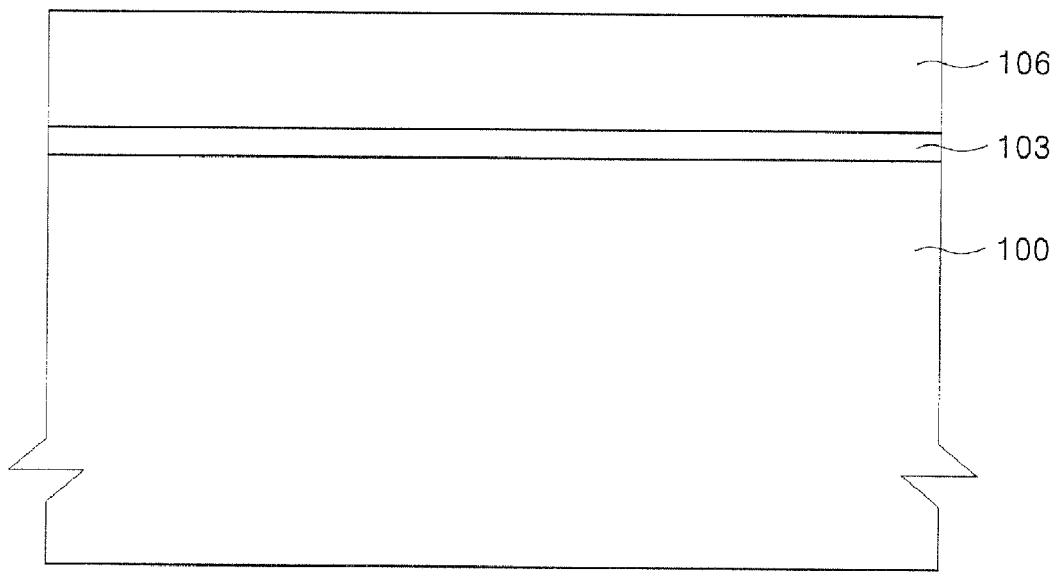
FIGS. 2B, 3B, 4B, 5B, 6B, 7B, 8B, 9B, 10B, 11B, 12B, 13B and 14B are cross-sectional views taken along line II-II' of FIG. 1, illustrating an exemplary method of fabricating a semiconductor device according to the first embodiment.

Referring to FIGS. 1, 2A and 2B, a semiconductor substrate 100 is prepared. The semiconductor substrate 100 may be a silicon substrate. The semiconductor substrate 100 may include a material such as SiC, SiGe or GaAs. A pad layer 103 may be formed on the semiconductor substrate 100. The pad layer 103 may include at least one of a thermal oxidation layer and a silicon nitride layer. A lower hard mask layer 106 may be formed on the pad layer 103. The lower hard mask layer 106 may include silicon oxide. In one embodiment, the lower hard mask layer 106 may include a silicon oxide layer. In one embodiment, the lower hard mask layer 106 is not formed (i.e., formation of the lower hard mask layer 106 is omitted).

Figure 3A:
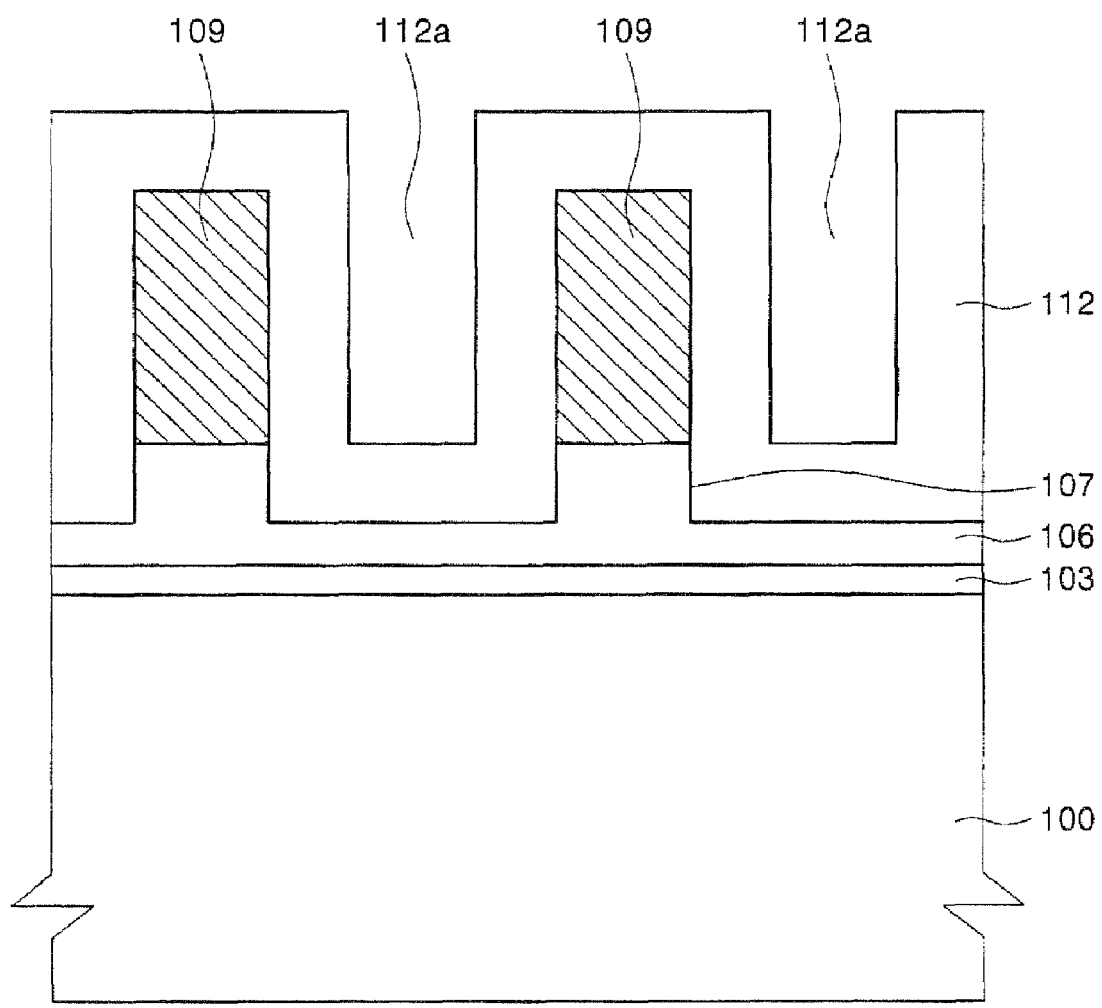
Figure 3B:
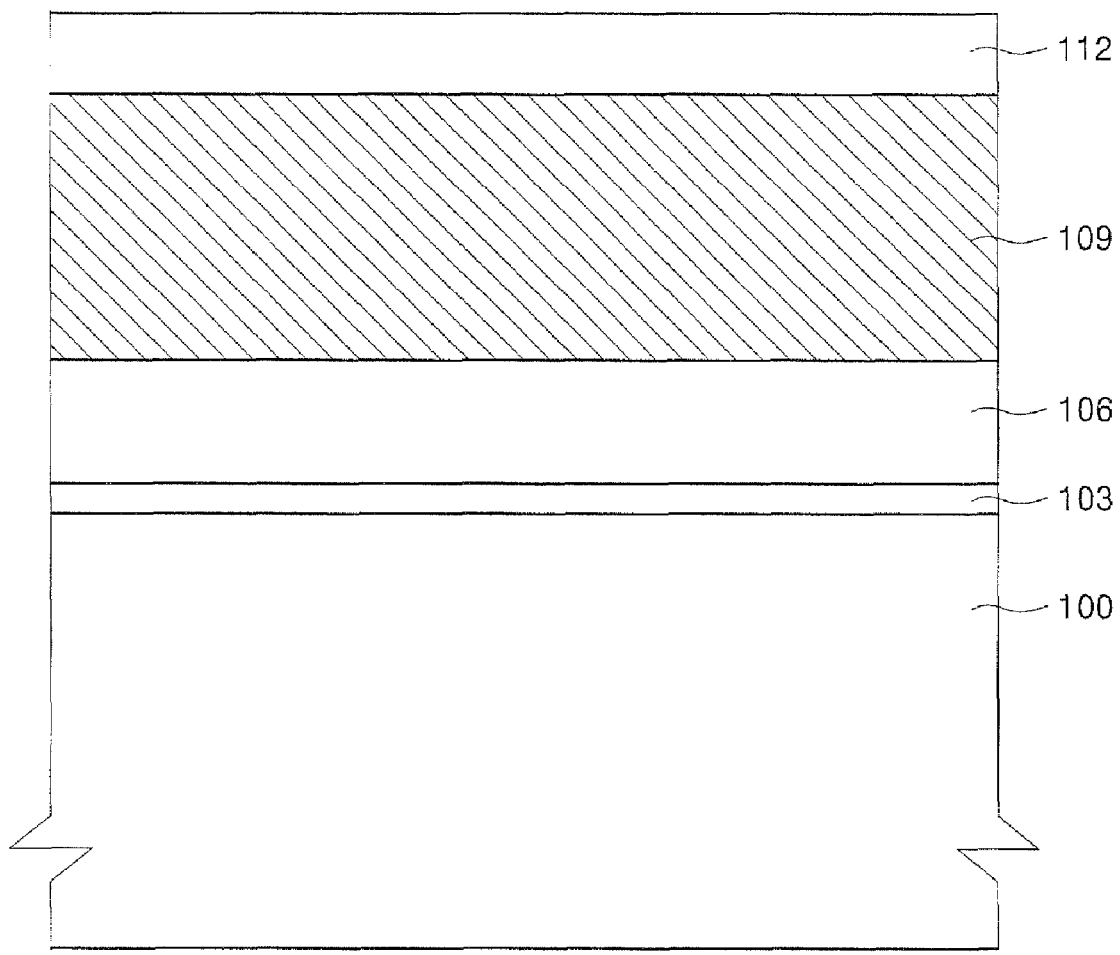

Referring to FIGS. 1, 3A and 3B, first upper hard mask patterns 109, spaced apart from one another, may be formed on the lower hard mask layer 106. Each of the first upper hard mask patterns 109 may include a material different from the lower hard mask layer 106. For example, when the lower hard mask layer 106 includes silicon oxide, the first upper hard mask patterns 109 may include poly-silicon or silicon nitride. Each of the first upper hard mask patterns 109 may be formed to have a line shape. In one embodiment, recessed regions 107 may be formed by partially etching the lower hard mask layer 106 around the first upper hard mask patterns 109.

A conformal sacrificial layer 112 covering the first upper hard mask patterns 109 and the recessed regions of the lower hard mask layer 106 may be formed. As a result, portions of the sacrificial layer 112 positioned between the first upper hard mask patterns 109 may define grooves 112a. The grooves 112a may be formed to have substantially the same width as the first upper hard mask patterns 109 by adjusting the thickness of the sacrificial layer 112. The bottom surfaces of the grooves 112a may be positioned substantially coplanar with the bottom surfaces of the first upper hard mask patterns 109.

The sacrificial layer 112 may include a material having an etch selectivity with respect to the first upper hard mask patterns 109. For example, when the first upper hard mask patterns 109 include poly-silicon, the sacrificial layer 112 may include silicon oxide.

Meanwhile, the sacrificial layer 112 and the lower hard mask layer 106 may include substantially the same material. For example, the sacrificial layer 112 and the lower hard mask layer 106 may both substantially include silicon oxide.

When the lower hard mask layer 106 is not formed, the sacrificial layer 112 may be formed to cover the sidewalls of the first upper hard mask patterns 109.

Figure 4A:
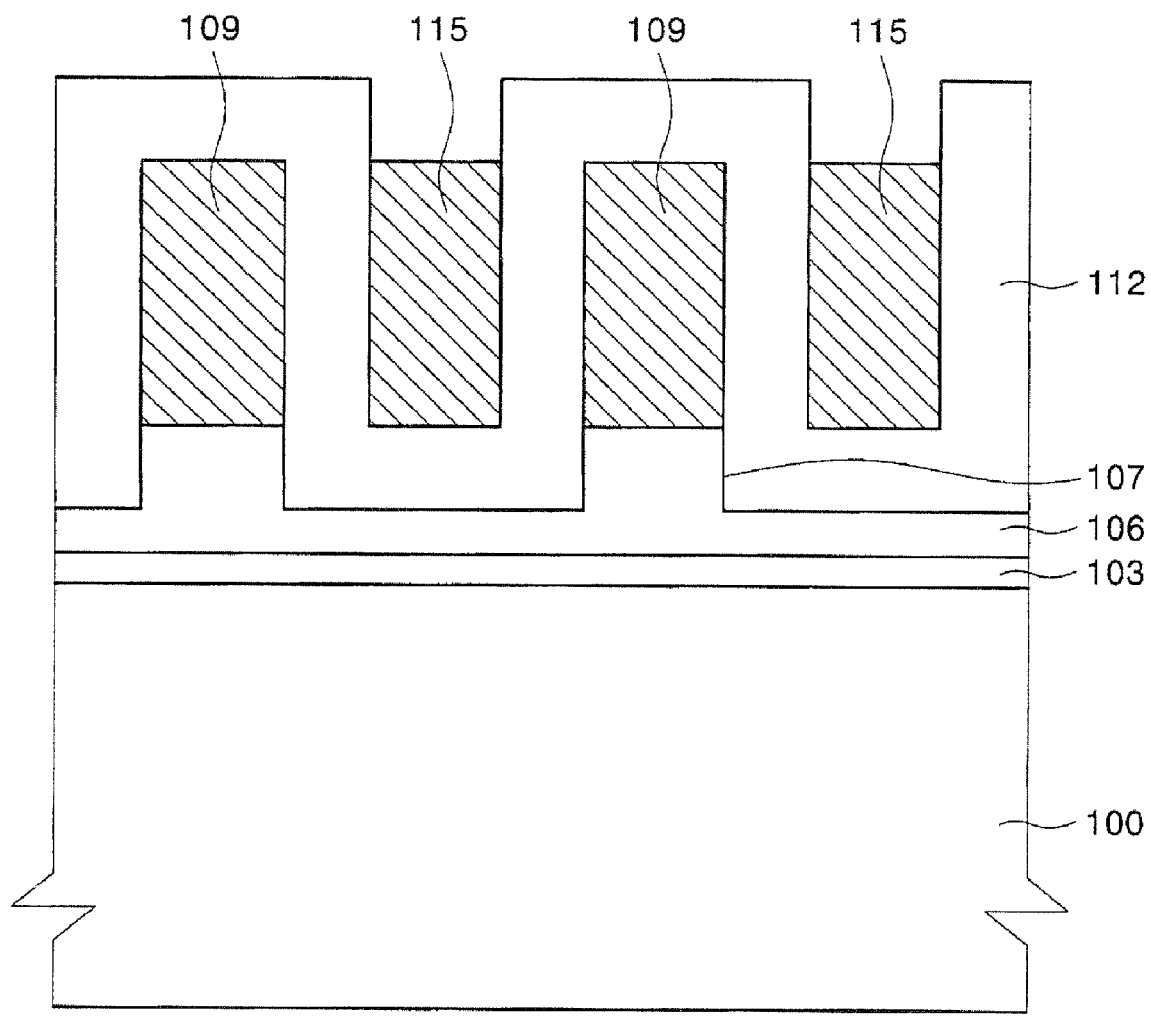
Figure 4B:
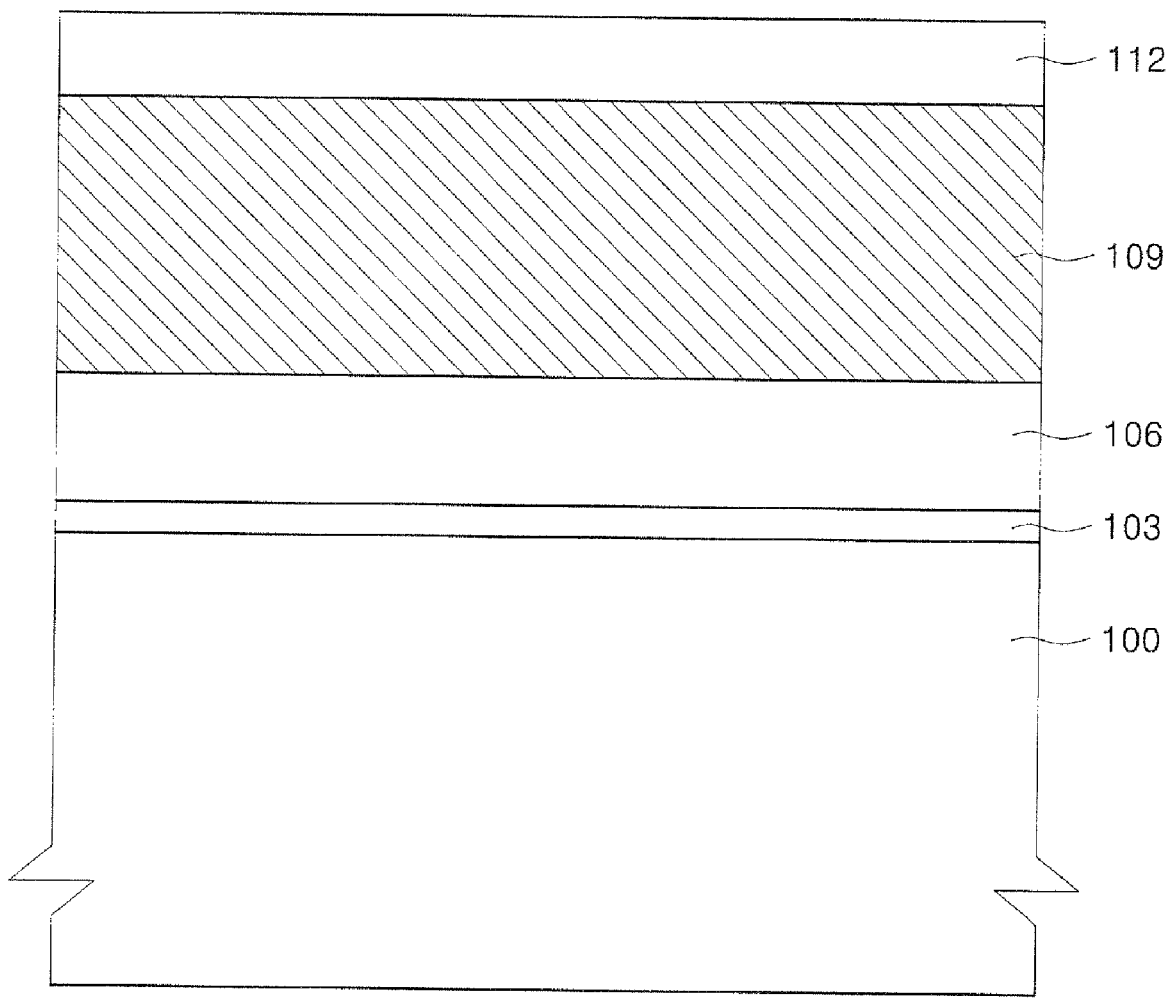

Referring to FIGS. 1, 4A and 4B, second upper hard mask patterns 115 having a substantially uniform thickness and a line shape may be formed in the grooves 112a defined by the sacrificial layer 112. Each of the second upper hard mask patterns 115 may be positioned between the first upper hard mask patterns 109 and be surrounded by the sacrificial layer 112. Accordingly, sidewalls and bottom surfaces of the second upper hard mask patterns 115 may be surrounded by the sacrificial layer 112. The second upper hard mask patterns 115 may include the same material as the first upper hard mask patterns 109.

In one embodiment, the second upper hard mask patterns 115 may be positioned at substantially the same level as the first upper hard mask patterns 109. For example, the second upper hard mask patterns 115 may be formed by forming an upper hard mask material layer on the semiconductor substrate 100 having the sacrificial layer 112 and planarizing the upper hard mask material layer until the top surface of the upper hard mask material layer is substantially coplanar with the top surfaces of the first upper hard mask patterns 109. An etchback and/or chemical mechanical polishing (CMP) technique may be used to planarize the upper hard mask material layer. When planarizing the upper hard mask material layer using an etchback process, the upper hard mask material layer may be etched such that the top surfaces of the second upper hard mask patterns 115 are substantially coplanar with the top surfaces of the first upper hard mask patterns 109. When planarizing the upper hard mask material layer using a CMP technique, the upper hard mask material layer may be planarized until the top surfaces of the first upper hard mask patterns 109 are exposed.

Figure 5A:
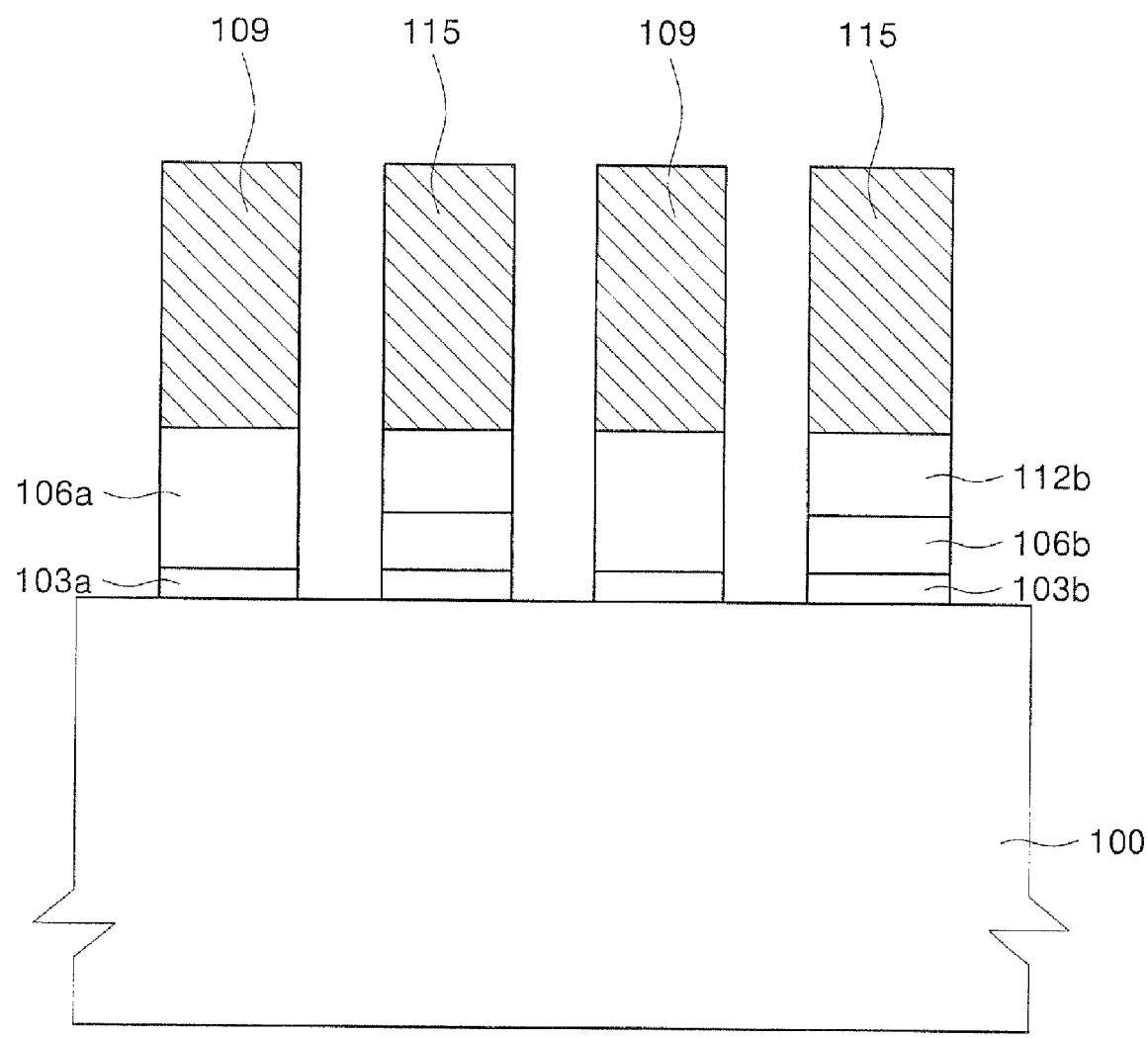
Figure 5B:
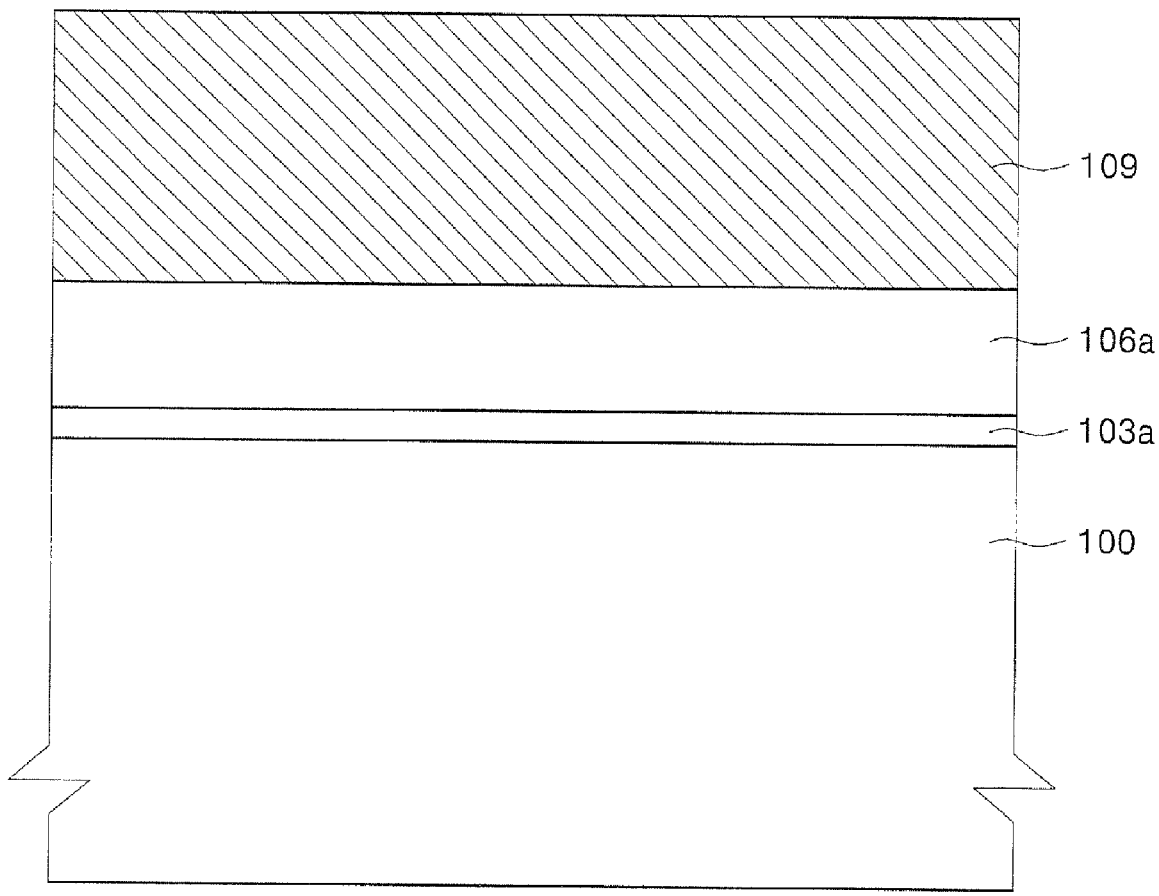

Referring to FIGS. 1, 5A and 5B, portions of the sacrificial layer 112 exposed by the second upper hard mask layer 115 may be etched. The lower hard mask layer 106 and the pad layer 103 may also be etched after etching the exposed sacrificial layer 112. As a result, first pad patterns 103a and first lower hard mask patterns 106a, which are sequentially stacked, may be formed beneath the first upper hard mask patterns 109. Also as a result, second pad patterns 103b, second lower hard mask patterns 106b and sacrificial patterns 112b, which are sequentially stacked, may be formed beneath the second upper hard mask patterns 115.

Figure 6A:
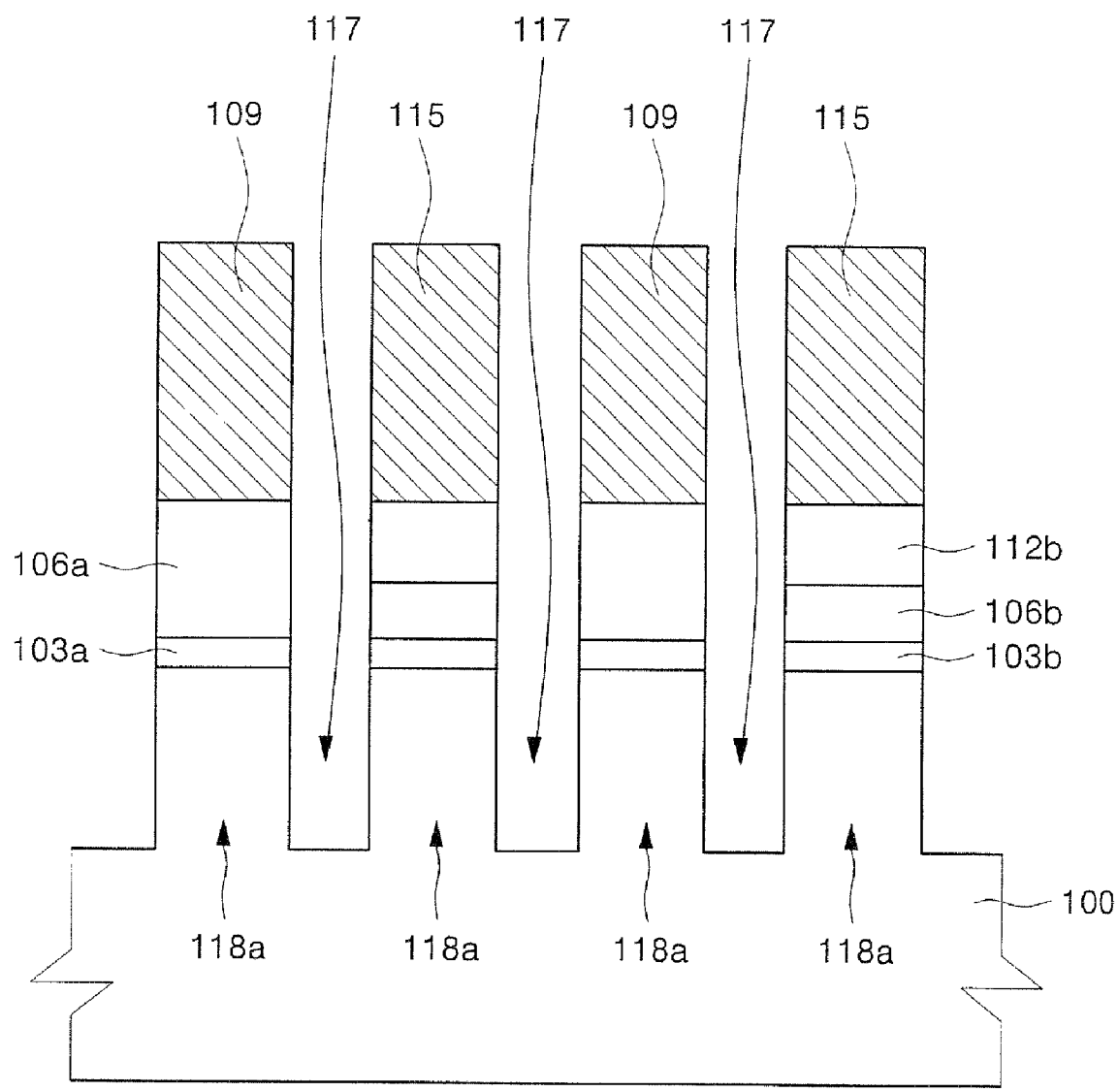
Figure 6B:
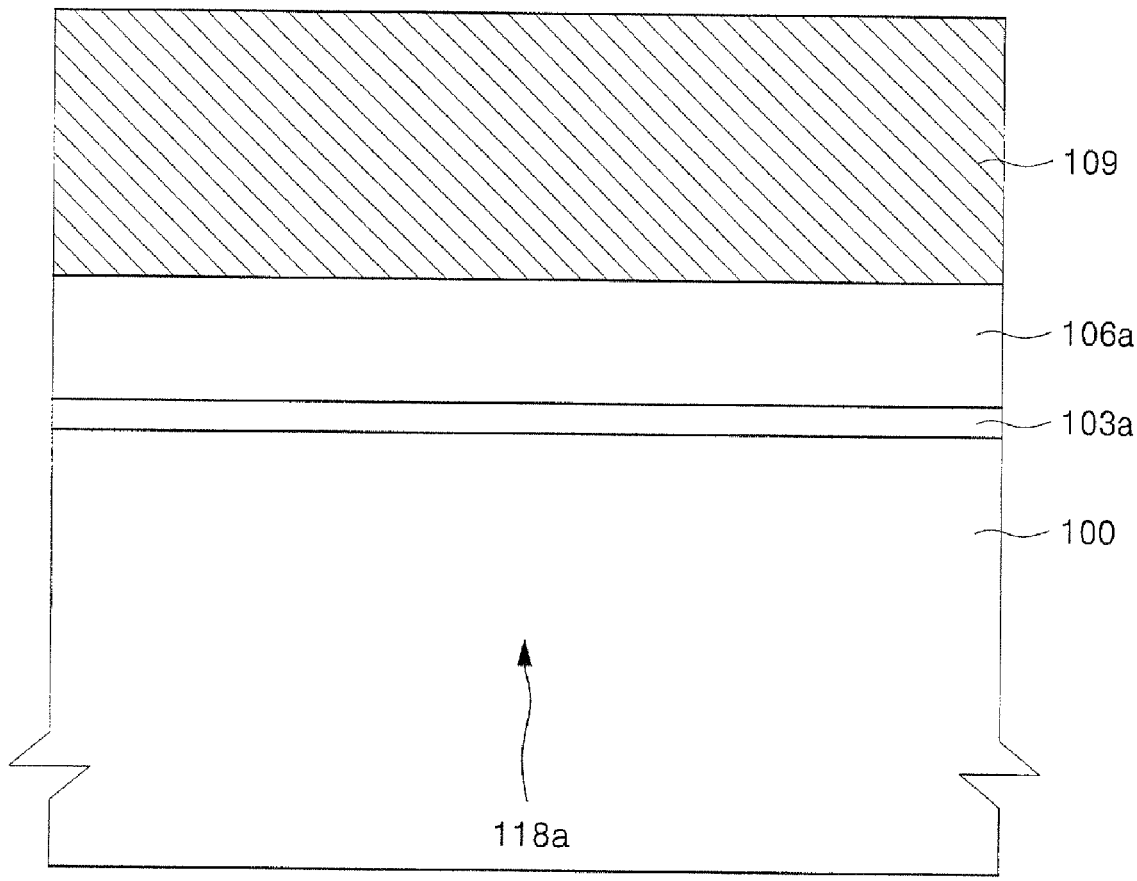

Referring to FIGS. 1, 6A and 6B, trenches 117 may be formed by etching the semiconductor substrate 100 using the first and second pad patterns 103a and 103b, the first and second lower hard mask patterns 106a and 106b, and the first and second upper hard mask patterns 109 and 115 as an etching mask. Thus, active regions 118a may be defined by the trenches 117 in the semiconductor substrate 100. Since the first and second upper hard mask patterns 109 and 115 are formed to have a line shape, each of the active regions 118a may be defined to have a line shape and extend along a longitudinal direction across the semiconductor substrate 100.

Figure 7A:
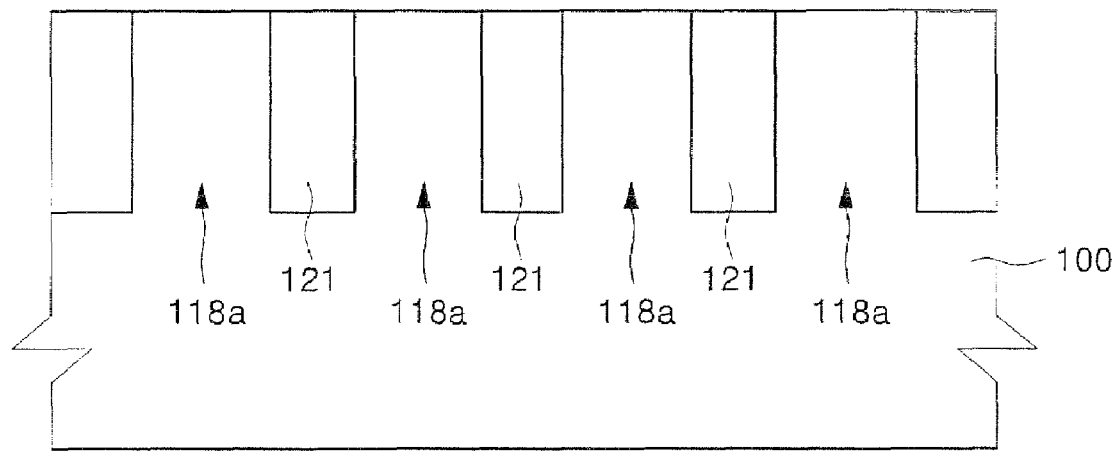
Figure 7B:
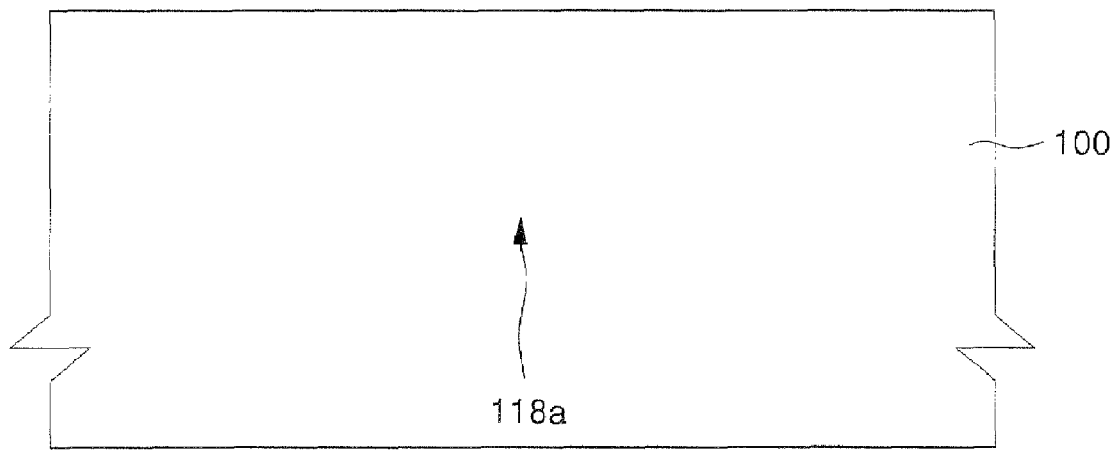

Referring to FIGS. 1, 7A and 7B, an isolation layer 121 may be formed to substantially fill the trenches 117. The isolation layer 121 may include an insulating layer such as a high density plasma oxide.

The isolation layer 121 may be formed by forming an insulating layer filling the trenches 117 shown in FIG. 6A and then removing the sequentially-stacked first and second pad patterns 103a and 103b, the first and second lower hard mask patterns 106a and 106b, and the first and second upper hard mask patterns 109 and 115.

Figure 8A:
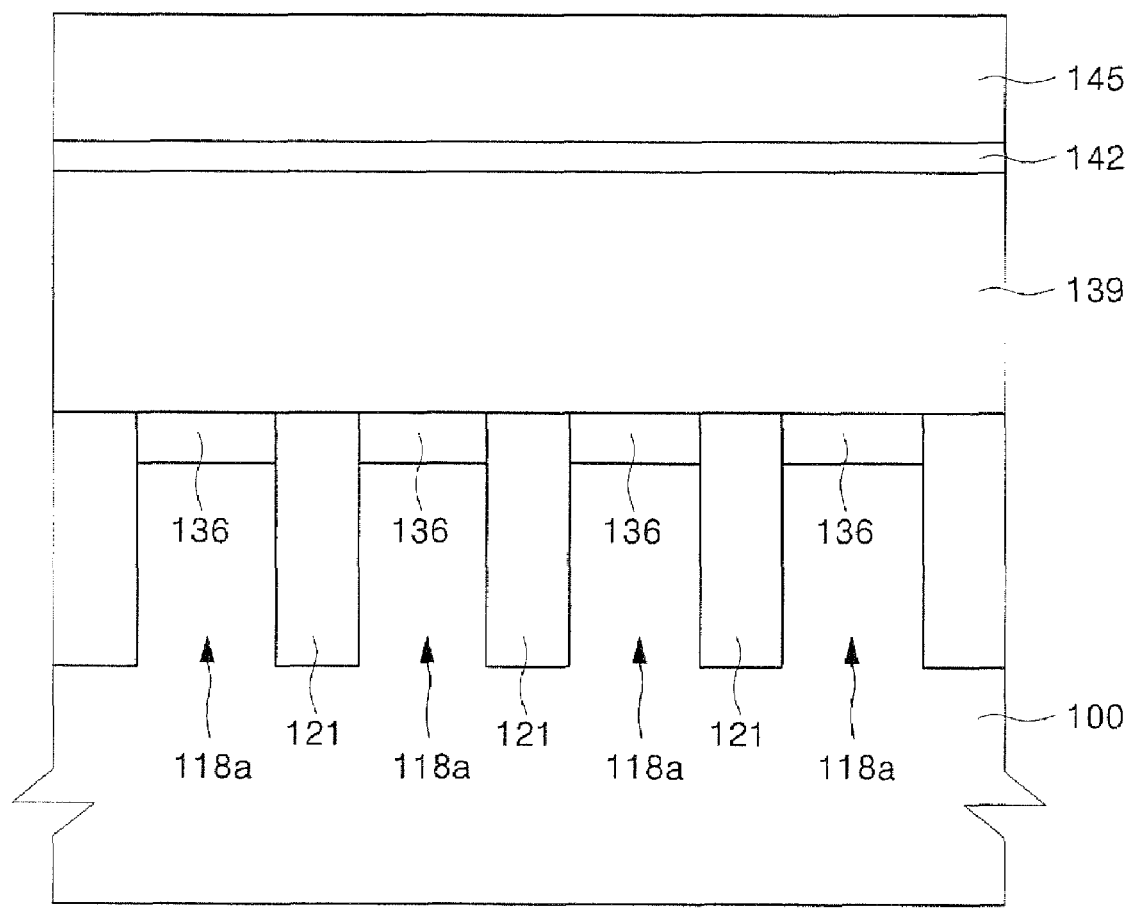
Figure 8B:
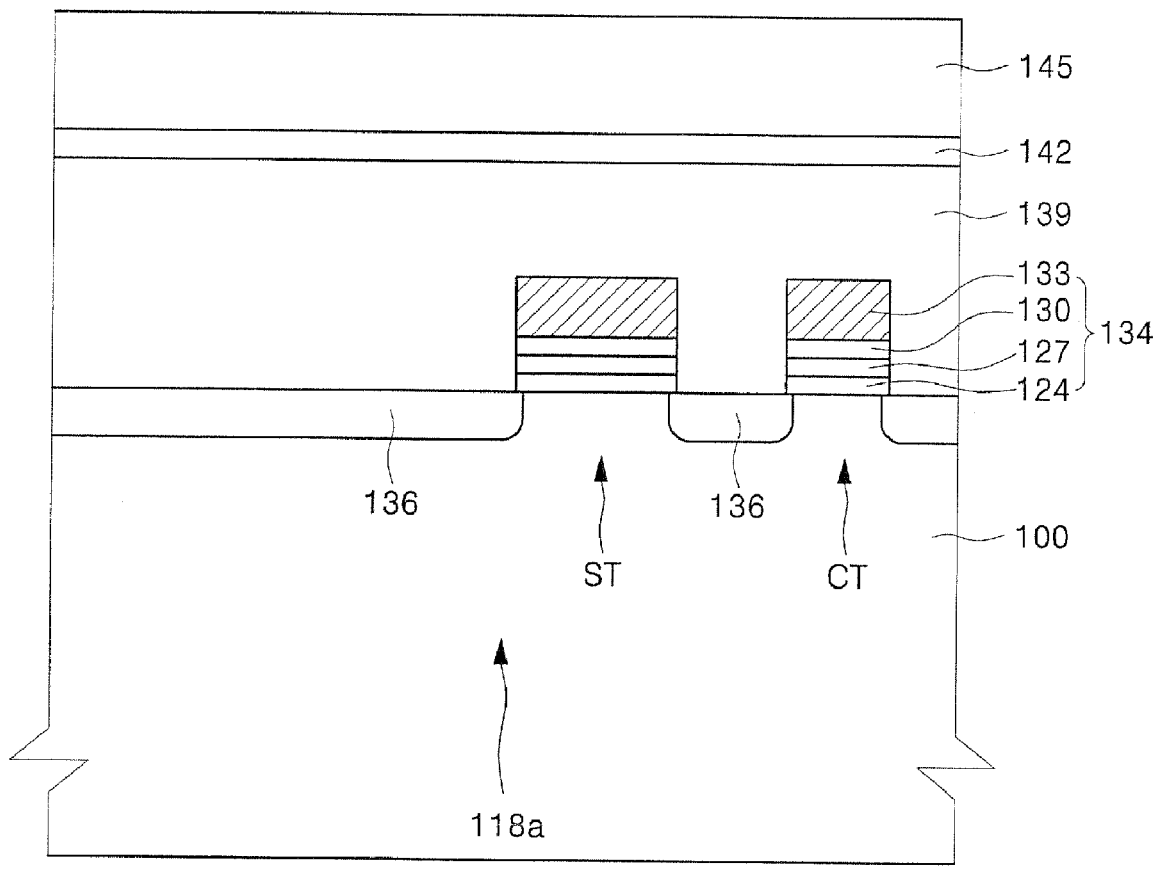

Referring to FIGS. 1, 8A and 8B, transistors may be formed on each of the active regions 118a. The transistors may include gate structures 134 formed on each of the active regions 118a and impurity regions 136 formed in each of the active regions 118a at both sides of the gate structures 134. The impurity regions 136 may, for example, include source/drain regions. At least one of the transistors may be a cell transistor CT and at least one of the transistors may be a selection transistor ST. A gate electrode of the cell transistor CT may serve as a word line WL and extend to cross above the active regions 118a. A gate electrode of the selection transistor ST may serve as a string selection line SSL or ground selection line GSL and extend to cross above the active regions 118a.

In one embodiment, the cell transistor CT may be a cell transistor of a flash memory device. In one embodiment, the gate structure 134 of the cell transistor CT may include a first dielectric layer 124, a data storage layer 127, a second dielectric layer 130 and a gate electrode 133, which are sequentially stacked. The first dielectric layer 124 may be a tunnel dielectric layer. The second dielectric layer 130 may be a blocking dielectric layer. Here, the tunnel dielectric layer may have at least one layer including a material such as silicon oxide, silicon oxide nitride (SiON), nitrogen-doped Si oxide, a high-k dielectric material, or the like or a combination thereof. The high-k dielectric material may, for example, include Al oxide, Zr oxide, Hf oxide, La oxide, or the like or a combination thereof. The data storage layer 127 may have at least one layer including a material such as silicon oxide nitride (SiON), silicon nitride, a high-k dielectric material, or the like or a combination thereof. The second dielectric layer 130 may have at least one layer including a material such as silicon oxide (e.g., a medium temperature oxide (MTO)), a high-k dielectric material, or the like or a combination thereof.

In one embodiment, the data storage layer 127 may include a nanocrystalline structure. For example, the nanocrystalline structure may include a material such as W, Ti, Ta, Cu, Mo, Ni, or the like or a combination thereof, or a nitride thereof. In another example, the nanocrystalline structure may include a material such as an oxide of Zr, Hf, Y, Al, or the like or a combination thereof. In another example, the nanocrystalline structure may include a material such as silicon, germanium (Ge), silicon nitride, boron, boron nitride, or the like or a combination thereof.

In another embodiment, the gate structure 134 of the cell transistor CT may include a gate dielectric layer, a floating gate, an inter-gate dielectric layer and a control gate, which are sequentially stacked.

Subsequently, an interlayer dielectric layer 139 may be formed on the semiconductor substrate 100 having the transistors ST and CT. The interlayer dielectric layer 139 may include, for example, silicon oxide. An etch stop layer 142 may be formed on the interlayer dielectric layer 139. The etch stop layer 142 may include, for example, silicon nitride. A buffer layer 145 may be formed on the etch stop layer 142. The buffer layer 145 may include a material having an etch selectivity with respect to the etch stop layer 142. For example, when the etch stop layer 142 includes silicon nitride, the buffer layer 145 may include a material such as silicon oxide.

Figure 9A:
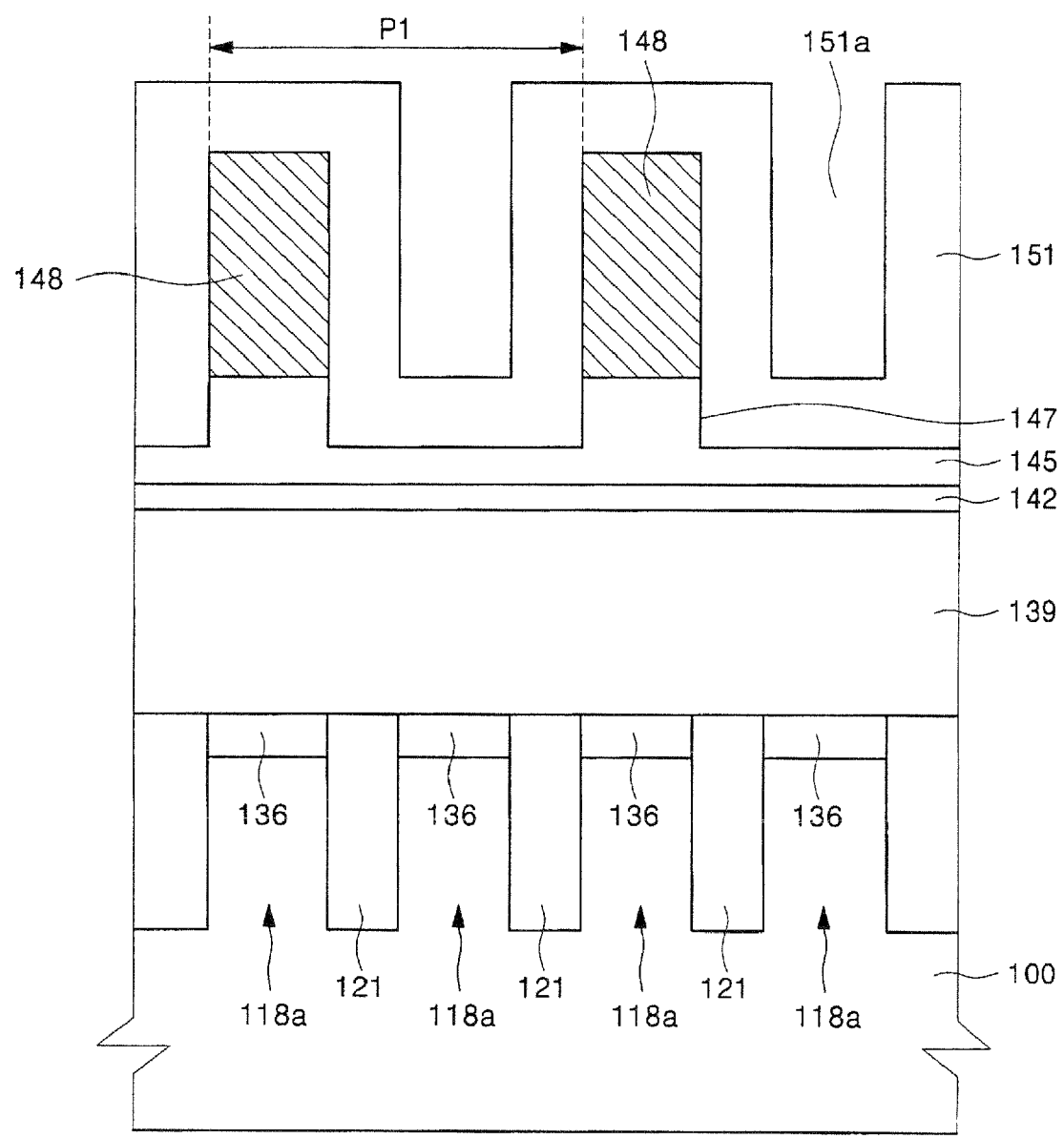
Figure 9B:
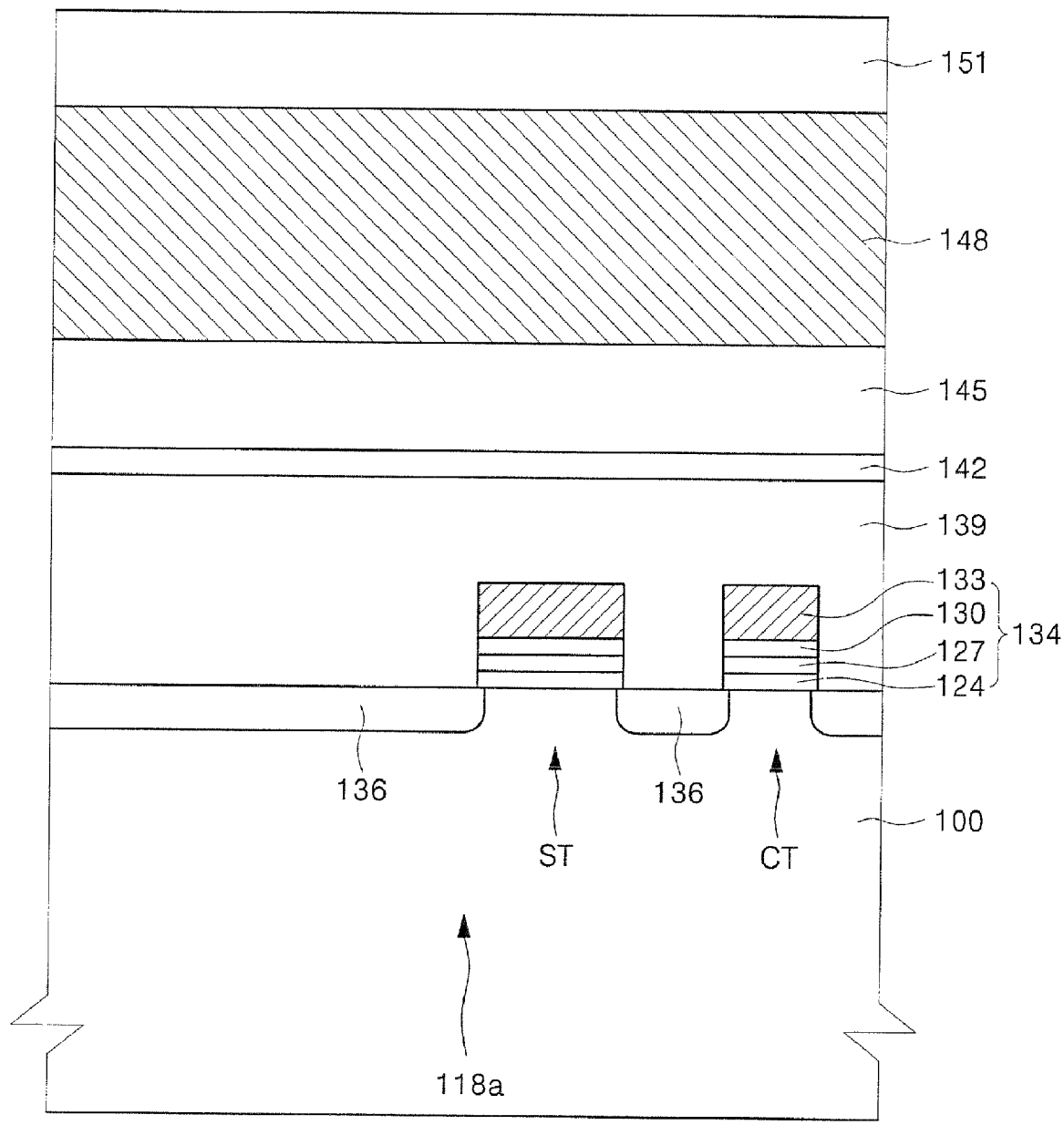

Referring to FIGS. 1, 9A and 9B, a first molding layer may be formed on the buffer layer 145. The first molding layer may include a material having an etch selectivity with respect to the buffer layer 145. For example, the first molding layer may include a material such as poly-silicon. Subsequently, the first molding layer may be patterned to form first molding lines 148 having a line shape. Photolithography and etching processes may be used to pattern the first molding layer.

In one embodiment, each of the first molding lines 148 may be formed to overlap with odd-numbered or even-numbered active regions in the active regions 118a. Accordingly, a pitch P1 between the first molding lines 148 may be larger than a minimum resolution achievable by the photolithography process used to pattern the first molding layer. As described above, the first molding lines 148 are formed to have a line shape. Thus, the first molding lines 148 may have a substantially uniform width.

A recessed region 147 may be formed by partially etching portions of the buffer layer 145 between the first molding lines 148. A conformal spacer layer 151 may be formed on the semiconductor substrate 100 having the first molding lines 148. The spacer layer 151 may cover the top surfaces and sidewalls of the first molding lines 148, as well as portions of the buffer layer 145 defining the recessed regions 147. As a result, the spacer layer 151 may define line-shaped grooves 151a located over the buffer layer 145 between the first molding lines 148. The grooves 151a may be formed to have substantially the same width as the first molding lines 148 by adjusting the thickness of the spacer layer 151. The bottom surfaces of the grooves 151a may be substantially coplanar with the bottom surfaces of the first molding lines 148. In one embodiment, the spacer layer 151 may include substantially the same material as the buffer layer 145.

Figure 10A:
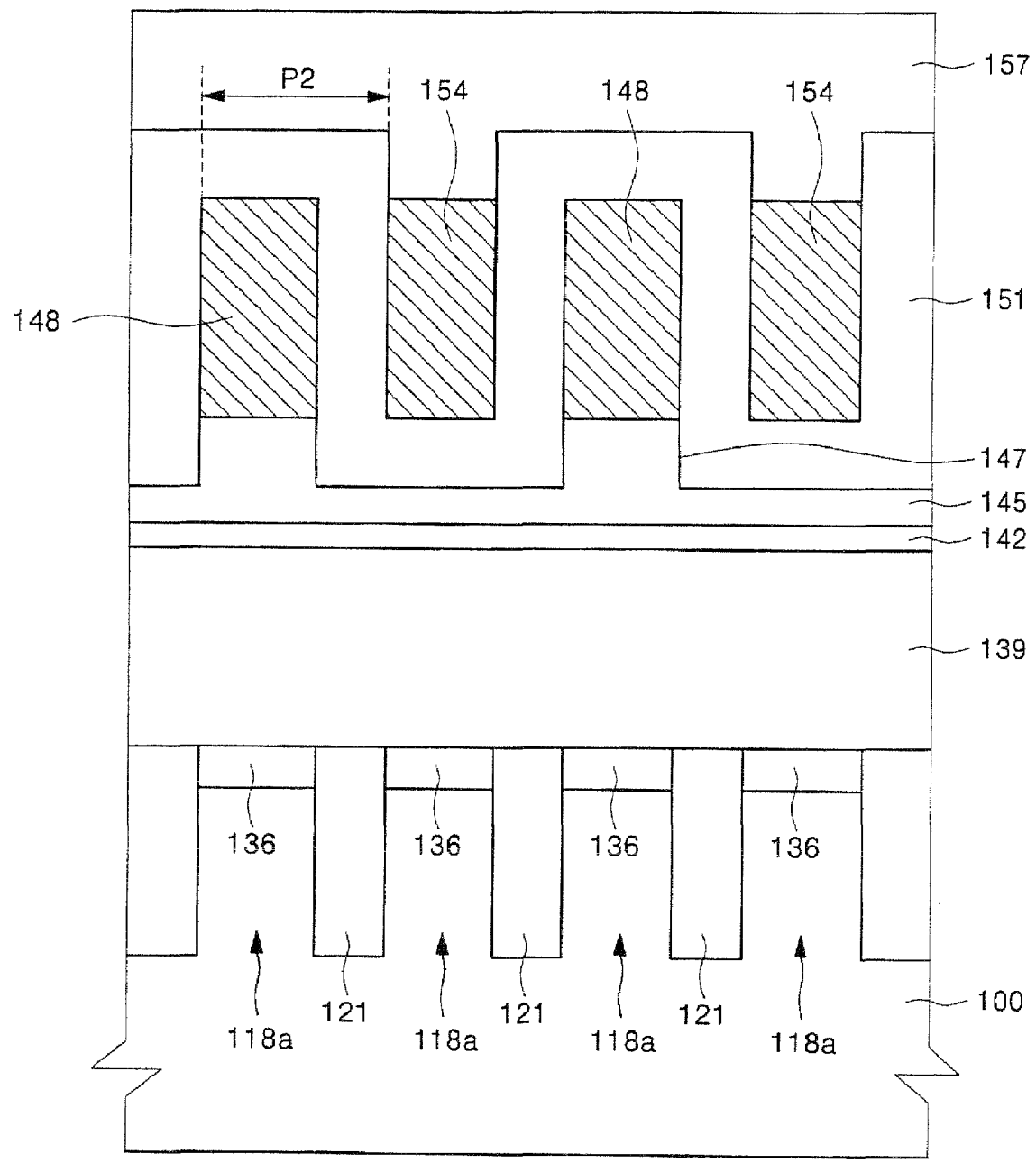
Figure 10B:
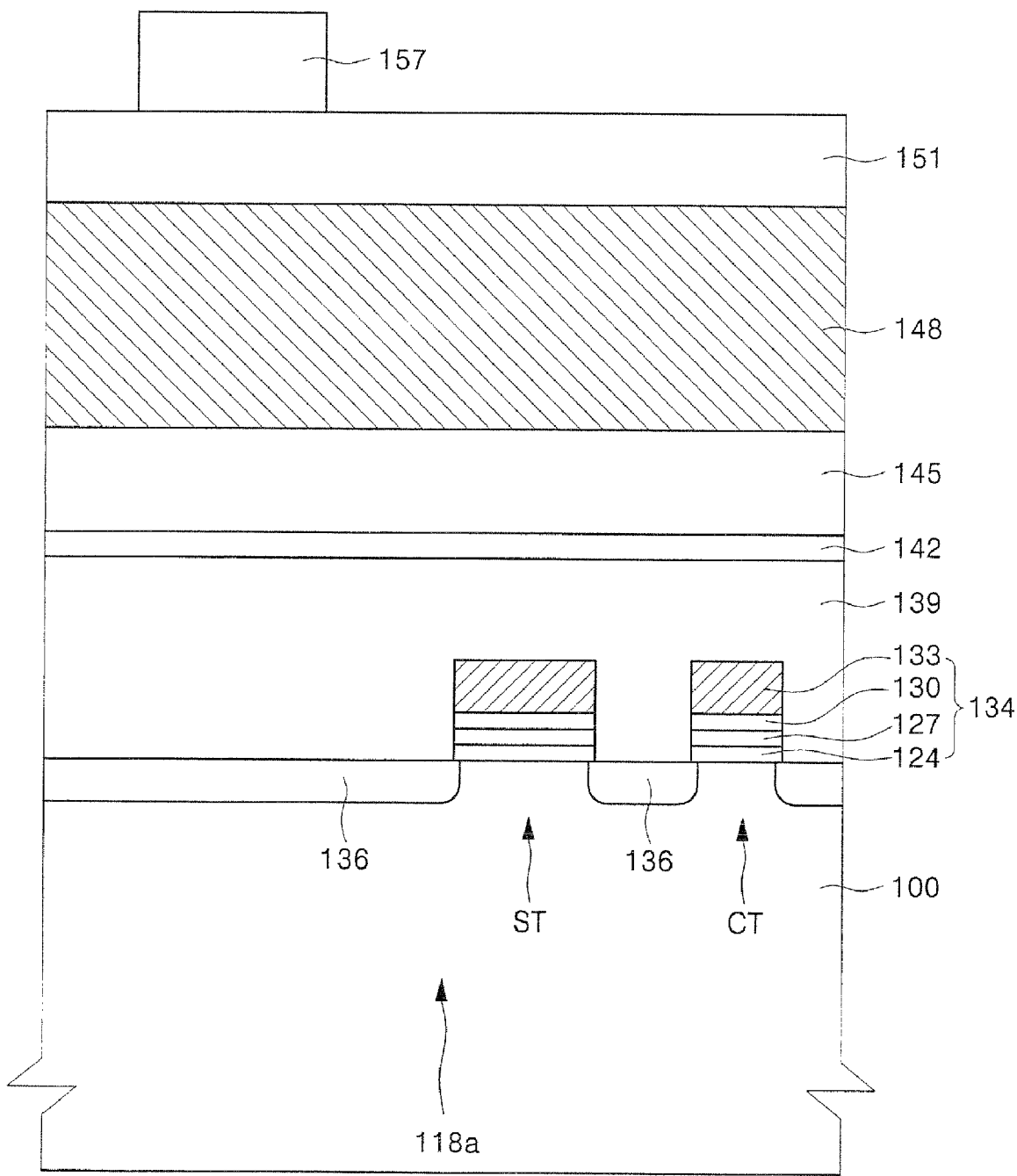

Referring to FIGS. 1, 10A and 10B, a second molding layer may be formed on the semiconductor substrate 100 having the spacer layer 151 so as to fill the grooves 151a. The second molding layer may include substantially the same material layer as the first molding layer. Subsequently, second molding layer may be patterned (e.g., planarized) to form second molding lines 154 filling the grooves 151a. Consequently, the second molding lines 154 may have a substantially uniform width and a line shape and be located over the buffer layer 145 between the first molding lines 148. The second molding lines 154 may be positioned at substantially the same level as the first molding lines 148. For example, the bottom surfaces of the second molding lines 154 may be substantially coplanar with bottom surfaces of the first molding lines 148. Moreover, the width of the second molding lines 154 may be substantially the same as the width of the first molding lines 148. In one embodiment, each of the first molding lines 148 overlaps with odd-numbered active regions 118a. Accordingly, each of the second molding lines 154 overlaps with even-numbered active regions 118a. Thus, a pitch P2 of the first and second molding lines 148 and 154 may be smaller than the pitch P1 of the between the first molding lines 148.

An etchback or CMP technique may be used to planarize the second molding layer. When planarizing the second molding layer using the etchback process, the second molding layer may be etched such that top surfaces of the second molding lines 154 are substantially coplanar with top surfaces of the first molding lines 148. When planarizing the second molding layer using the CMP technique, the second molding layer may be planarized until the top surfaces of the first molding lines 148 are exposed.

A line-shaped photoresist pattern 157 crossing over the first and second molding lines 148 and 154 may be formed on the semiconductor substrate 100 having the second molding lines 154. The photoresist pattern 157 may be formed to have a substantially uniform, predetermined width. When the second molding layer is planarized using the aforementioned etchback process, portions of the spacer layer 151 positioned over the first molding lines 148 may also be etched and the photoresist pattern 157 may be then formed. In one embodiment, the photoresist pattern 157 may be formed to cross over portions of active regions 118a such that the string selection line SSL of the selection transistor ST is horizontally between the photoresist pattern 157 and the word line WL of the cell transistor CT. The photoresist pattern 157 may be substantially parallel with the string selection line SSL.

Figure 11A:
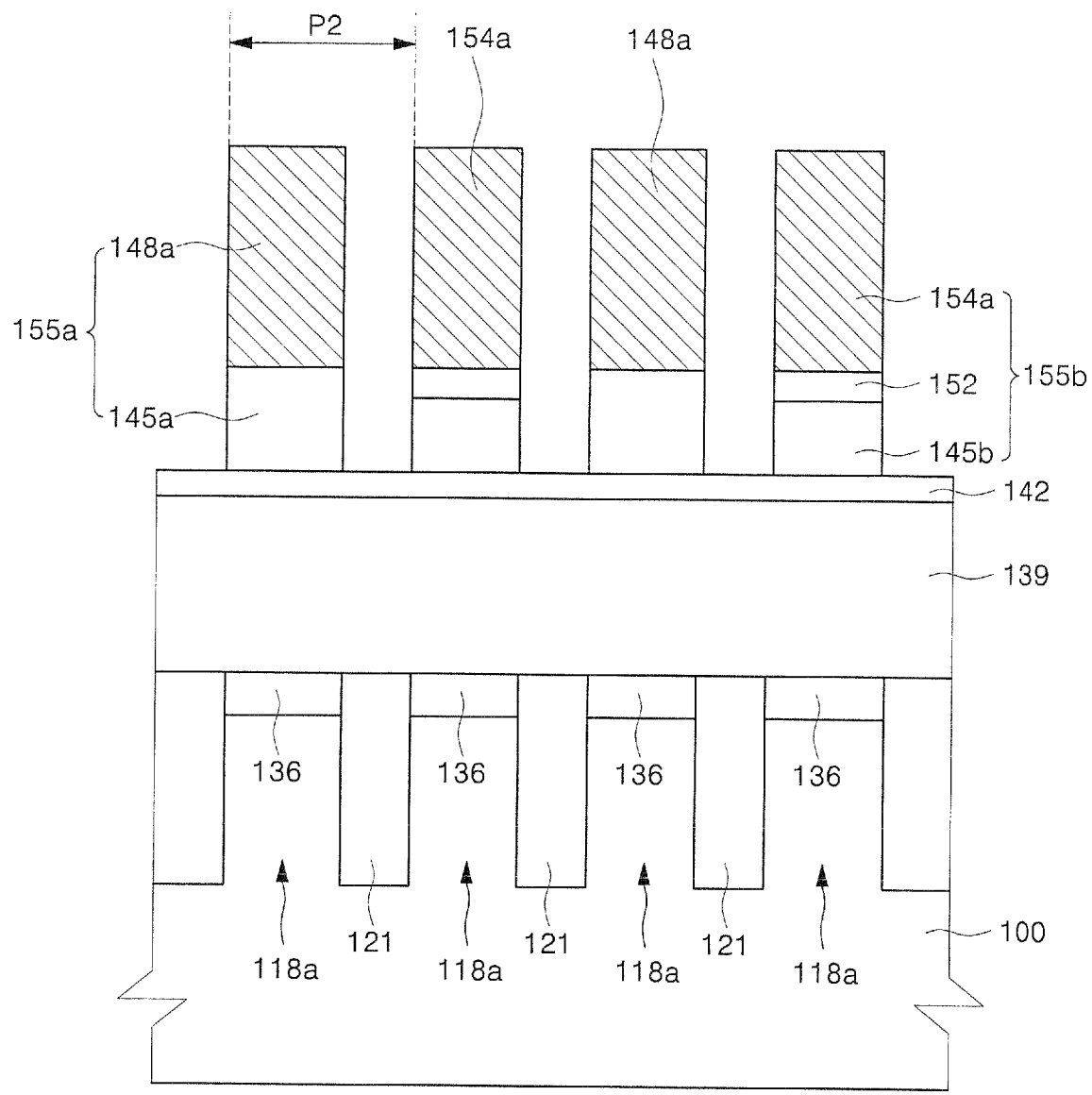
Figure 11B:
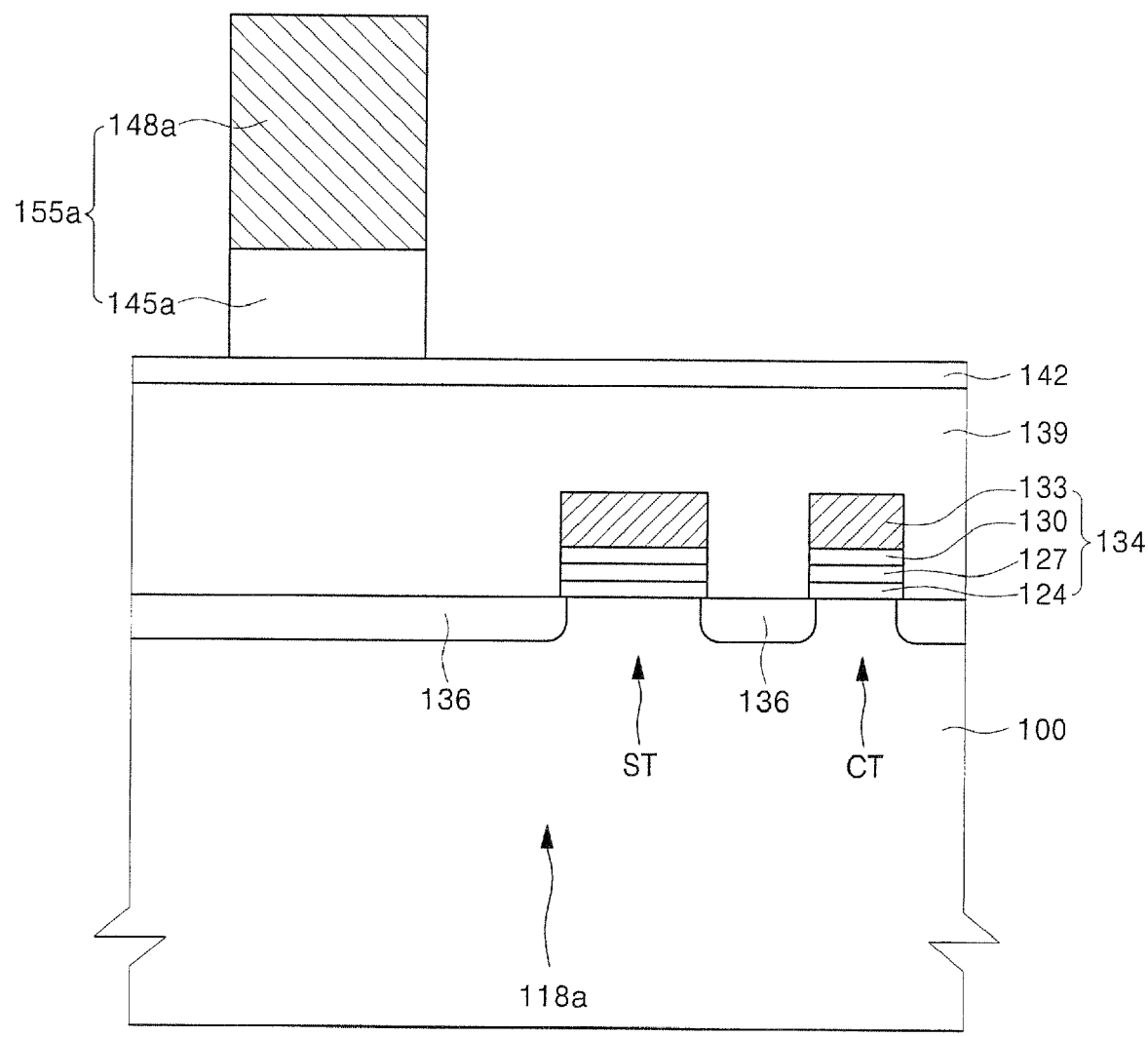

Referring to FIGS. 1, 11A and 11B, first and second molding patterns 148a and 154a may be formed by etching portions of the spacer layer 151 and the first and second molding lines 148 and 154 exposed by the photoresist pattern 157, using the photoresist pattern 57 as an etching mask. For example, the spacer layer 151 may be dry-etched using an etching gas having an etch selectivity with respect to the first and second molding lines 148 and 154. Then, the first and second molding lines 148 and 154 may be dry-etched.

According to one embodiment, because the line-shaped first and second molding lines 148 and 154 are patterned using the photoresist pattern 157 having the predetermined width, each of the first and second molding patterns 148a and 154a may be formed to have a substantially uniform width. Moreover, because the width of the second molding lines 154 is substantially the same as the width of the first molding lines 148, the width of the first molding patterns 148a may be substantially the same as the width of the second molding patterns 154a.

Subsequently, the photoresist pattern 157 may be removed (e.g., using an ashing strip process). Spacer patterns 152 may be formed beneath the second molding patterns 154a by etching portions of the spacer layer 151 between the first and second molding patterns 148a and 154a using the first and second molding patterns 148a and 154a as an etching mask, thereby exposing portions of the buffer layer 145. First buffer patterns 145a, located beneath the first molding patterns 148a, and second buffer patterns 145b, located beneath the spacer patterns 152, may be formed by etching the exposed portions of the buffer layer 145 using the first and second molding patterns 148a and 154a as an etching mask. Thus, sequentially-stacked first buffer patterns 145a and first molding patterns 148a may be formed on the etch stop layer 142. Similarly, sequentially-stacked second buffer patterns 145b, spacer patterns 152 and second molding patterns 154a may be formed on the etch stop layer 142. Accordingly, the sequentially-stacked first buffer patterns 145a and first molding patterns 148a may be referred to as first opening molding patterns 155a and the sequentially-stacked second buffer patterns 145b, spacer patterns 152 and second molding patterns 154a may be referred to as second opening molding patterns 155b.

In embodiments where the spacer layer 151 and the buffer layer 145 include substantially the same material, the spacer layer 151 and the buffer layer 145 may be etched during the same etching process.

When viewed from a plan view, each of the first and second opening molding patterns 155a and 155b may be formed to have major and minor axes. The major axes of the first and second opening molding patterns 155a and 155b may extend along substantially the same direction as the longitudinal direction of the active regions 118a.

Figure 12A:
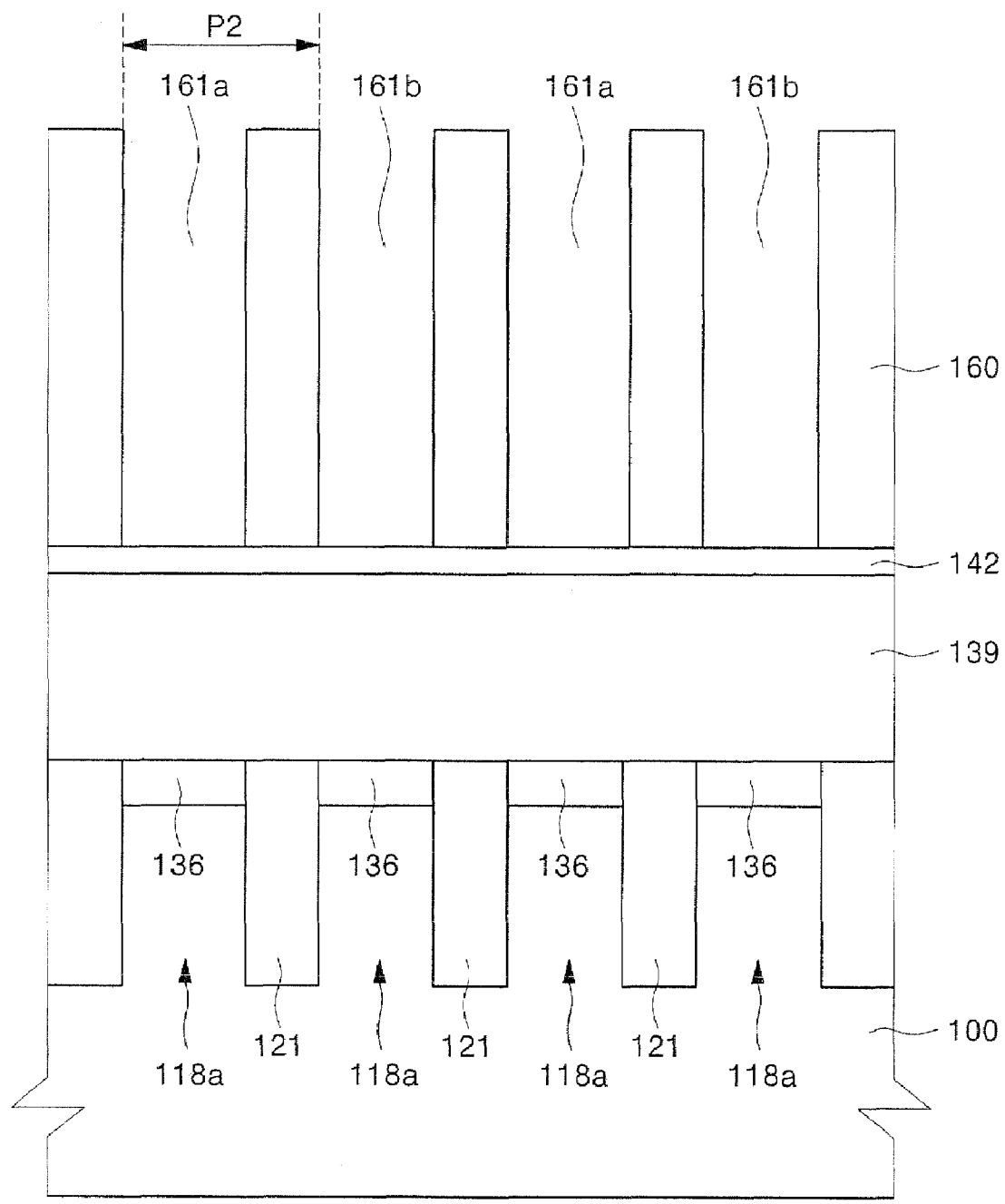
Figure 12B:
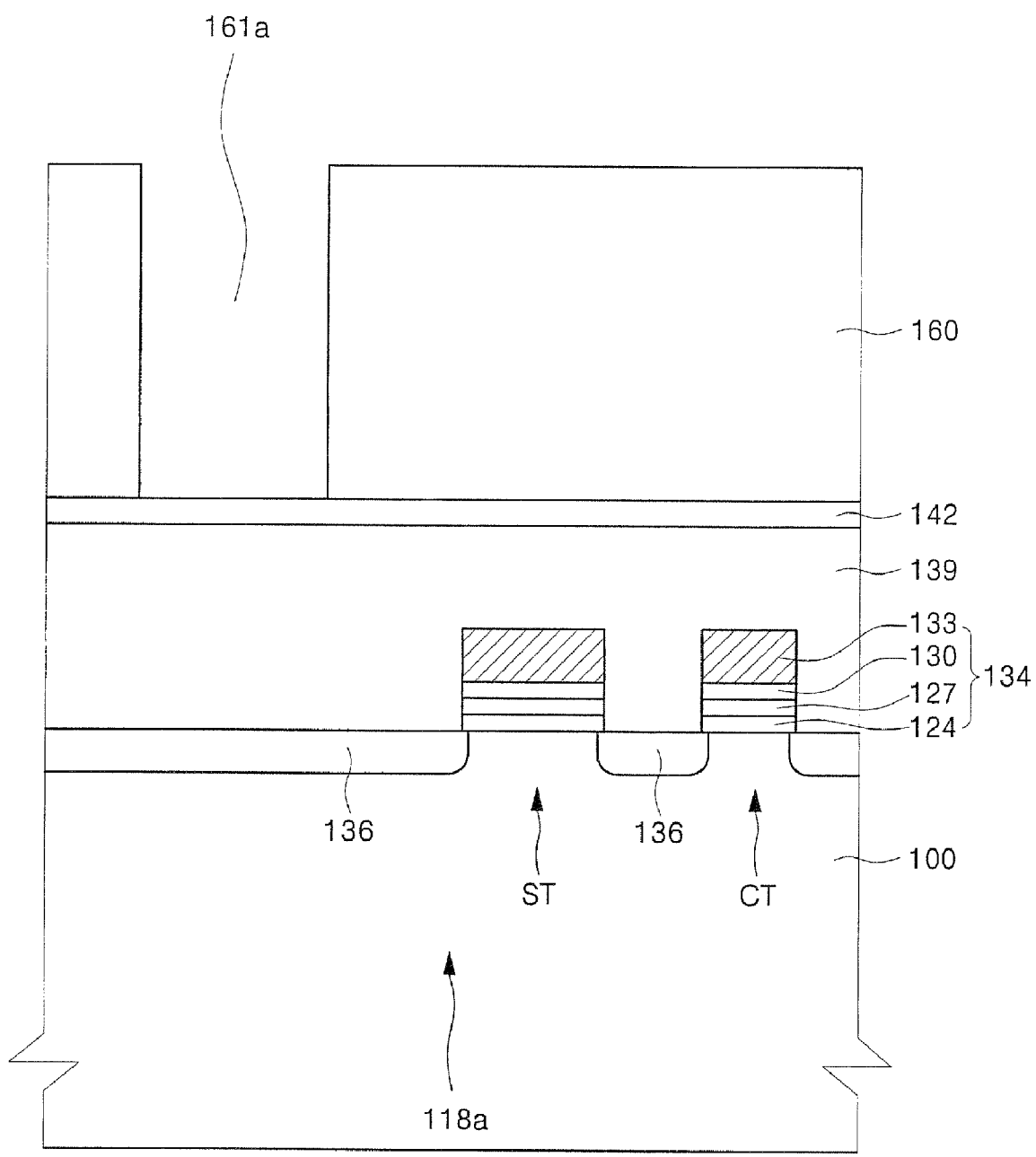

Referring to FIGS. 1, 12A and 12B, a mask layer may be formed on the semiconductor substrate 100 having the first and second opening molding patterns 155a and 155b. The mask layer may include a material having an etch selectivity with respect to the first and second molding patterns 148a and 154a, the spacer patterns 152 and the first and second buffer patterns 145a and 145b. For example, the mask layer may include an organic material such as a photoresist, an anti-reflective coating (ARC), an amorphous carbon material, or the like or a combination thereof.

Subsequently, the mask layer may be patterned (e.g., planarized) to form a mask pattern 160. In one embodiment, the mask layer may be planarized using an etchback process until the top surfaces of the first and second opening molding patterns 155a and 155b are exposed.

Thereafter, the first and second opening molding patterns 155a and 155b are removed to form first and second openings 161a and 161b within the mask pattern 160. In one embodiment, the first and second opening molding patterns 155a and 155b may be removed by etching the first and second molding patterns 148a and 154a and then etching the spacer patterns 152 and the first and second buffer patterns 145a and 145b. Accordingly, the first and second openings 161a and 161b may have the pitch P2 along a direction substantially parallel to the string selection line SSL.

Figure 13A:
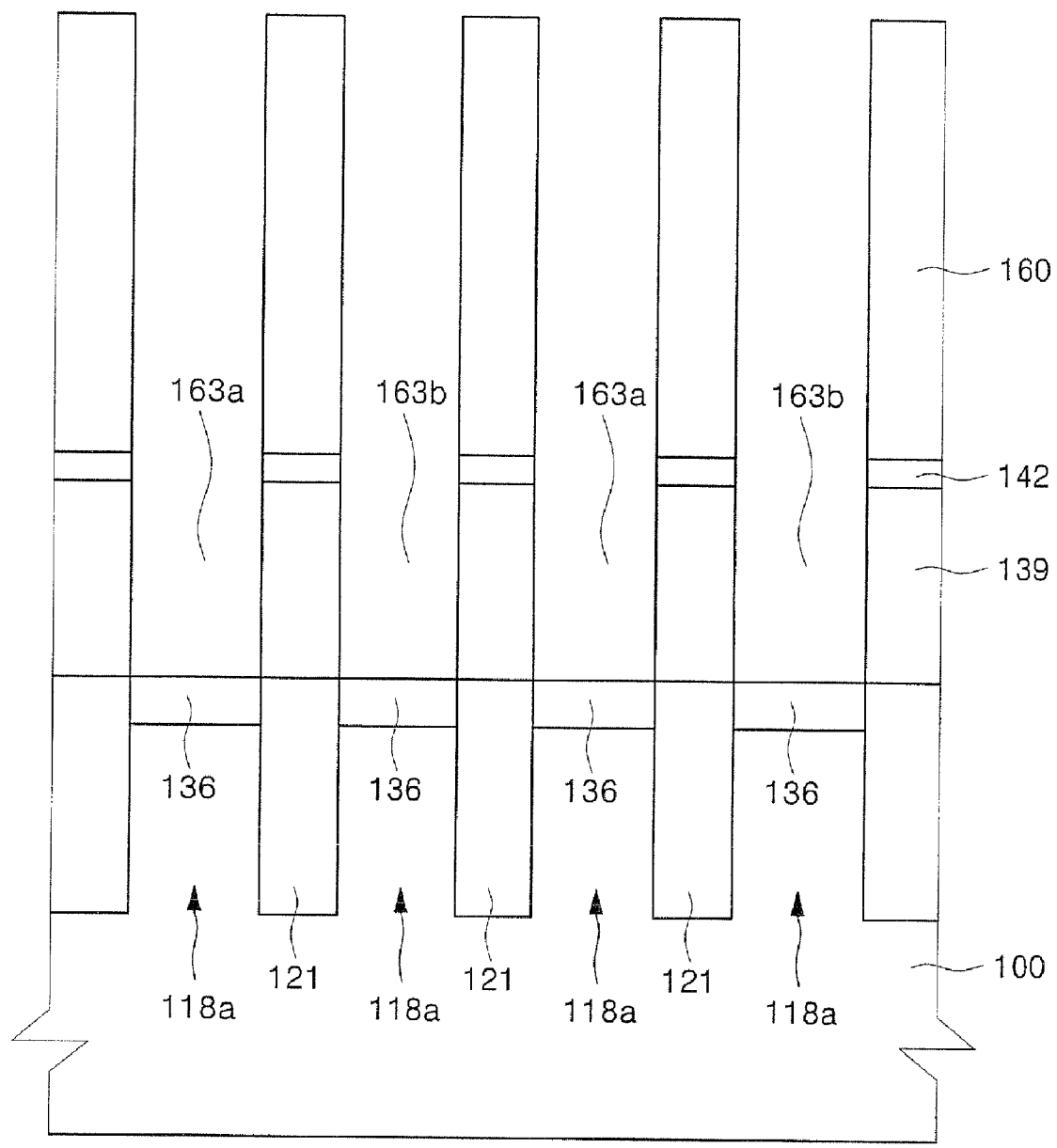
Figure 13B:
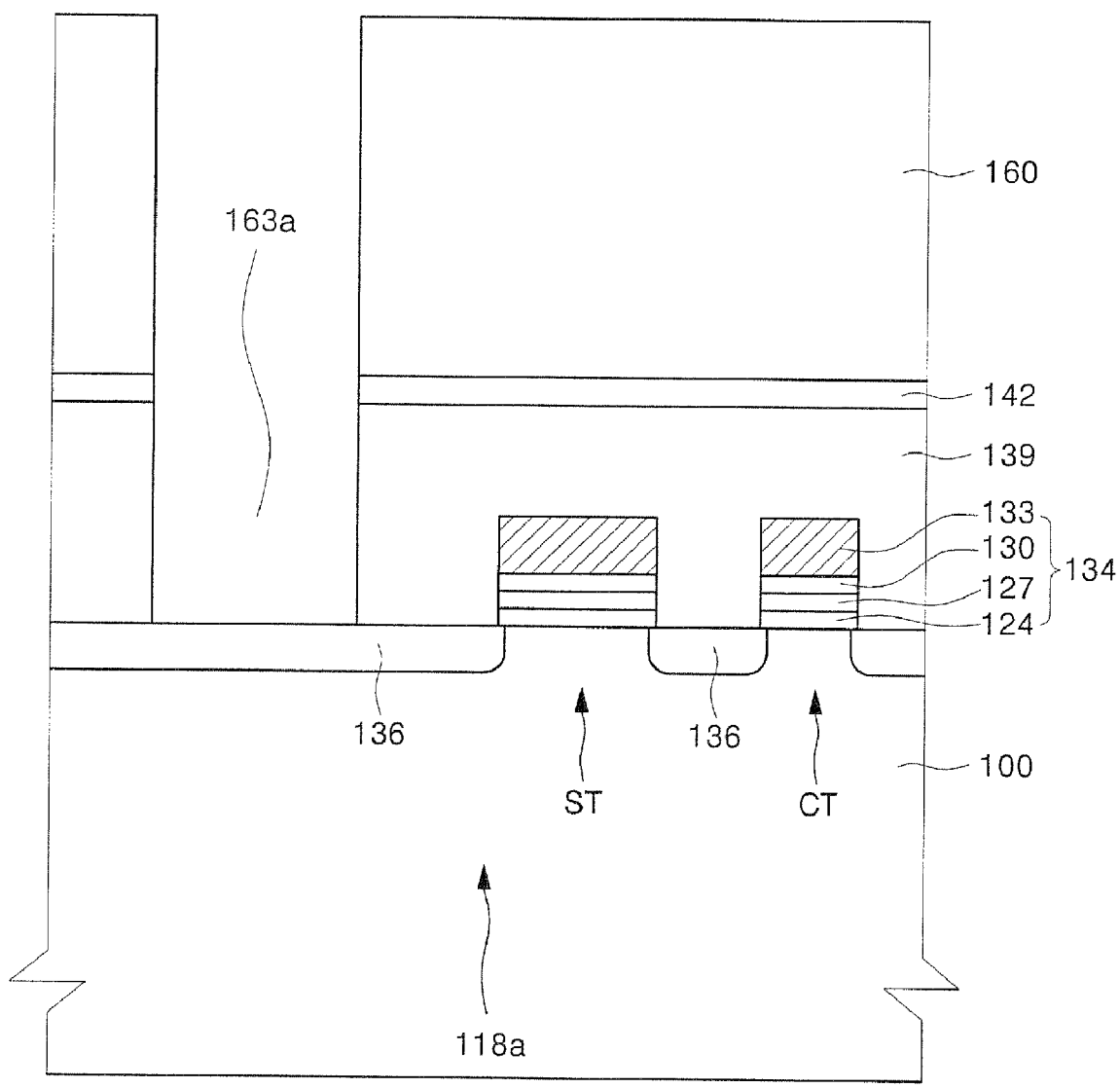

Referring to FIGS. 1, 13A and 13B, first and second contact holes 163a and 163b exposing the active regions 118a adjacent to the string selection line SSL may be formed by etching the etch stop layer 142 and the interlayer dielectric layer 139 using the mask pattern 160 as an etching mask. A dry etching process may be used in etching the etch stop layer 142 and the interlayer dielectric layer 139. Accordingly, the first and second contact holes 163a and 163b may be formed to have a substantially uniform size. Although the aspect ratio of the first and second contact holes 163a and 163b is large, the first and second contact holes 163a and 163b may be formed to have a substantially uniform size.

As mentioned above, the mask pattern 160 includes organic material. Accordingly, when the interlayer dielectric layer 139 is dry-etched to form the first and second contact holes 163a and 163b, the sidewalls of the first and second contact holes 163a and 163b may be coated with a thin polymer layer derived from the organic material of the mask pattern 160. Because the sidewalls of the first and second contact holes 163a and 163b are coated with the thin polymer layer, widths of the first and second contact holes 163a and 163b can be prevented from increasing to the point where the first and second contact holes 163a and 163b communicate with each other. Consequently, the first and second contact holes 163a and 163b may be formed to have substantially vertical sidewalls or positively-inclined sidewalls. When the first and second contact holes 163a and 163b have positively-inclined sidewalls, widths of each of the first and second contact holes 163a and 163b may become smaller along a direction from an upper region thereof to a lower region thereof.

Figure 14A:
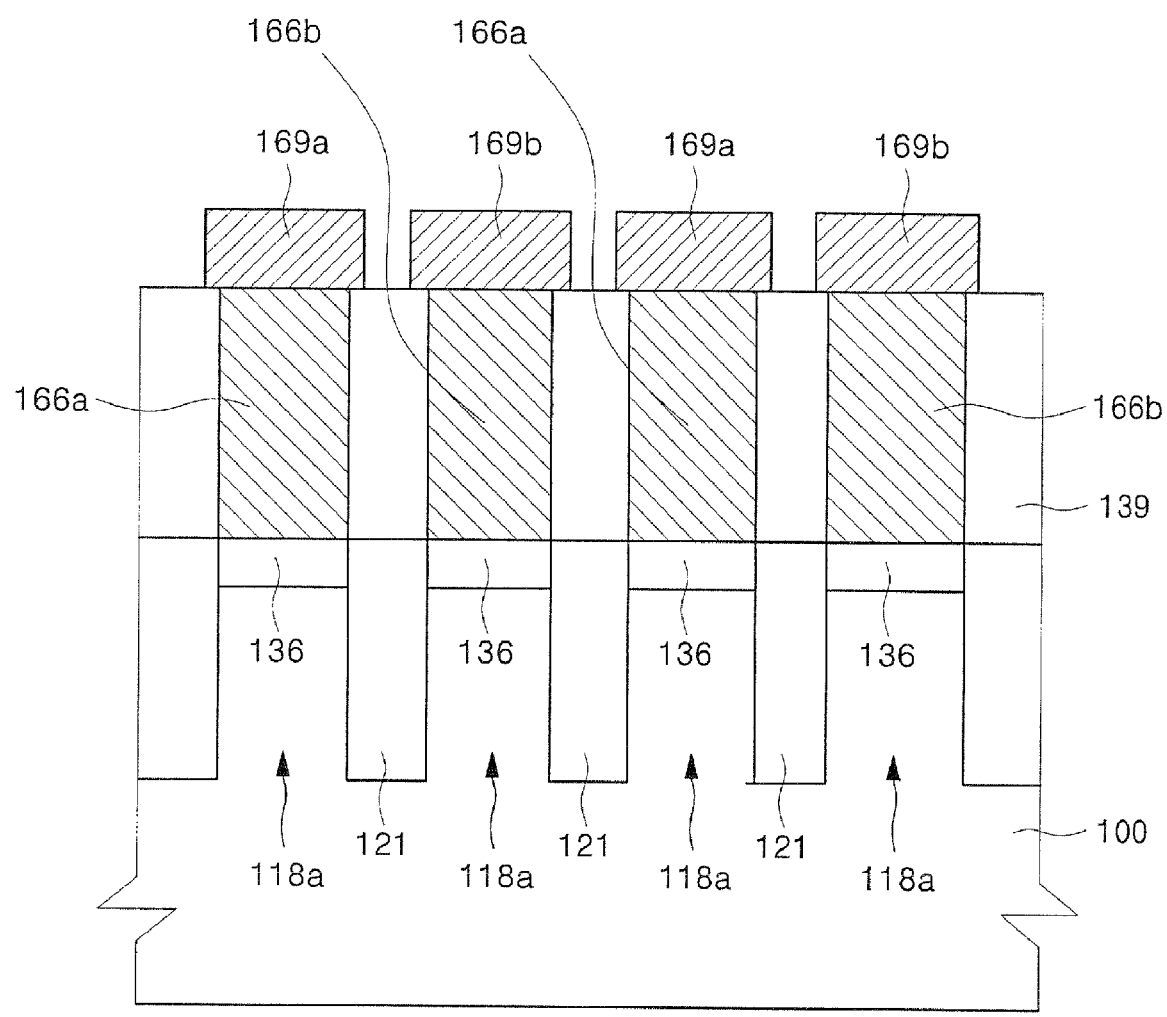
Figure 14B:
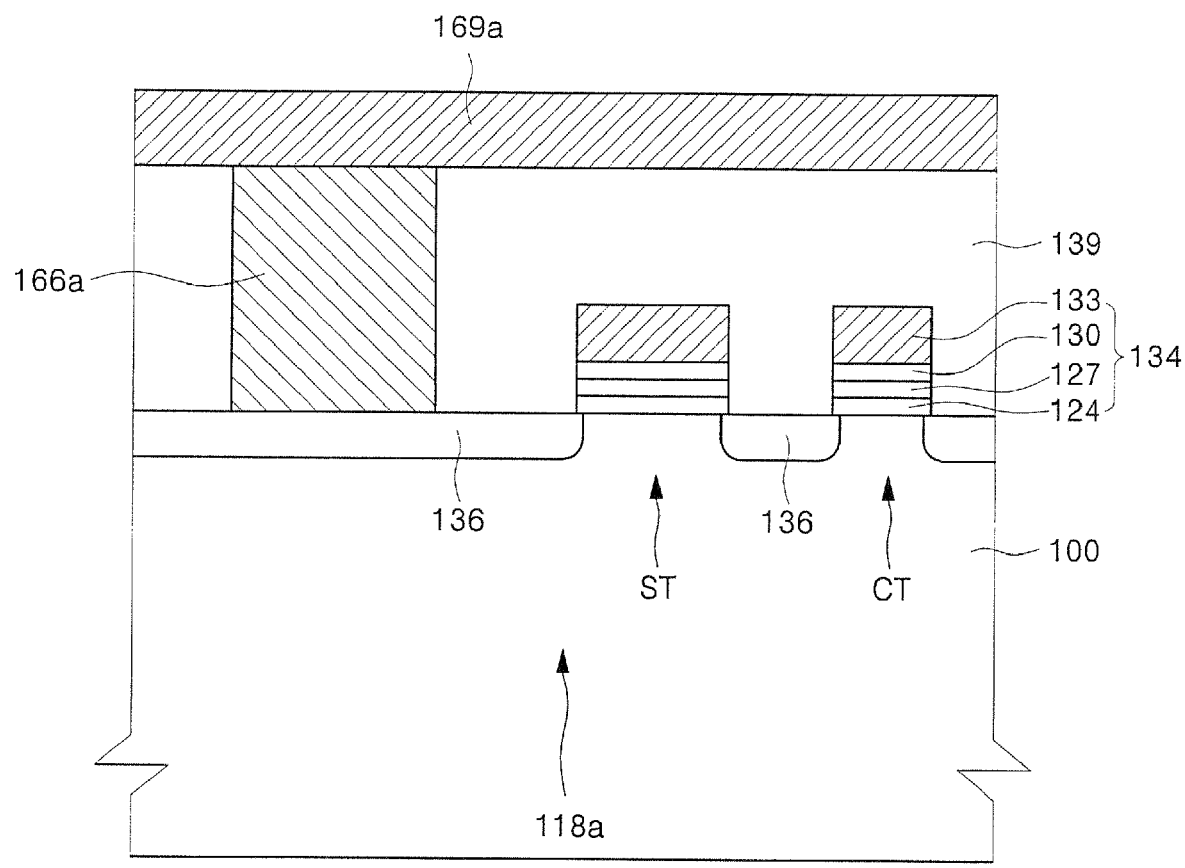

Referring to FIGS. 1, 14A and 14B, the mask pattern 160 may be removed. Thereafter, the etch stop layer 142 may be removed. A contact conductive layer may be formed on the semiconductor substrate 100 having the first and second contact holes 163a and 163b. In one embodiment, the contact conductive layer may include a material such as, for example, doped poly-silicon, metal, or the like or a combination thereof. The contact conductive layer may be planarized through a CMP or etchback process until the top surface of the interlayer dielectric layer 139 is exposed to form contact plugs CN filling the first and second contact holes 163a and 163b. The contact plugs CN may include first and second contact plugs 166a and 166b respectively filling the first and second contact holes 163a and 163b.

As described above with respect to FIGS. 11A and 11B, each of the first and second opening molding patterns 155a and 155b may be formed to have major and minor axes. Accordingly, each of the contact plugs CN may be formed to have major and minor axes as viewed from a plan view, wherein the major axes of the contact plugs CN extend along substantially the same direction as the longitudinal direction of the active regions 118a. As a result, the contact area of the contact plugs CN and the impurity regions 136 with each other can be made large to reduce a contact resistance between the contact plugs CN and the impurity regions 136.

Thereafter, first conductive lines 169a overlapping the first contact plugs 166a may be formed on the interlayer dielectric layer 139. Further, second conductive lines 169b positioned between the first conductive lines 169a and overlapping the second contact plugs 166b may be formed. Each of the first conductive lines 169a may be formed to overlap odd-numbered or even-numbered active regions in the active regions 118a. Each of the second conductive lines 169b may be formed to overlap active regions 118a positioned horizontally between the first conductive lines 169a. The first and second conductive lines 169a and 169b may be referred to as bit lines BL.

The first and second conductive lines 169a and 169b may be formed by forming first conductive lines 169a overlapping with the first contact plugs 166a on the interlayer dielectric layer 139, forming bit line spacers (not shown) covering the sidewalls of the first conductive lines 169a, forming second conductive lines 169b positioned between the first conductive lines 169a and having both sidewalls contacting the bit line spacers, and removing the bit line spacers. In one embodiment, however, the bit line spacers may not be removed (e.g., the removing of the bit line spacers may be omitted). Accordingly, bit line spacers may remain between the first and second conductive lines 169a and 169b.

According to the embodiments exemplary described above with respect to FIGS. 1 to 14B, each of the first and second openings 161a and 161b may be formed to have a substantially uniform size as compared with a case where openings are formed directly in the mask pattern 160 through a photolithography process. Thus, each of the subsequently-formed first and second contact holes 163a and 163b is formed to have substantially uniform dimensions when viewed in sectional and plan views. Accordingly, the first and second contact plugs 166a and 166b, respectively filling the first and second contact holes 163a and 163b, can have a substantially uniform resistance.

Hereinafter, an exemplary method of fabricating a semiconductor device according to a second embodiment will be described with reference to FIGS. 1 and 15A through 20B.

FIGS. 15A, 16A, 17A, 18A, 19A and 20A are cross-sectional views taken along line I-I' of FIG. 1, illustrating an exemplary method of fabricating a semiconductor device according to a second embodiment. FIGS. 15B, 16B, 17B, 18B, 19B and 20B are cross-sectional views taken along line II-II' of FIG. 1, illustrating an exemplary method of fabricating a semiconductor device according to the second embodiment.

Figure 15A:
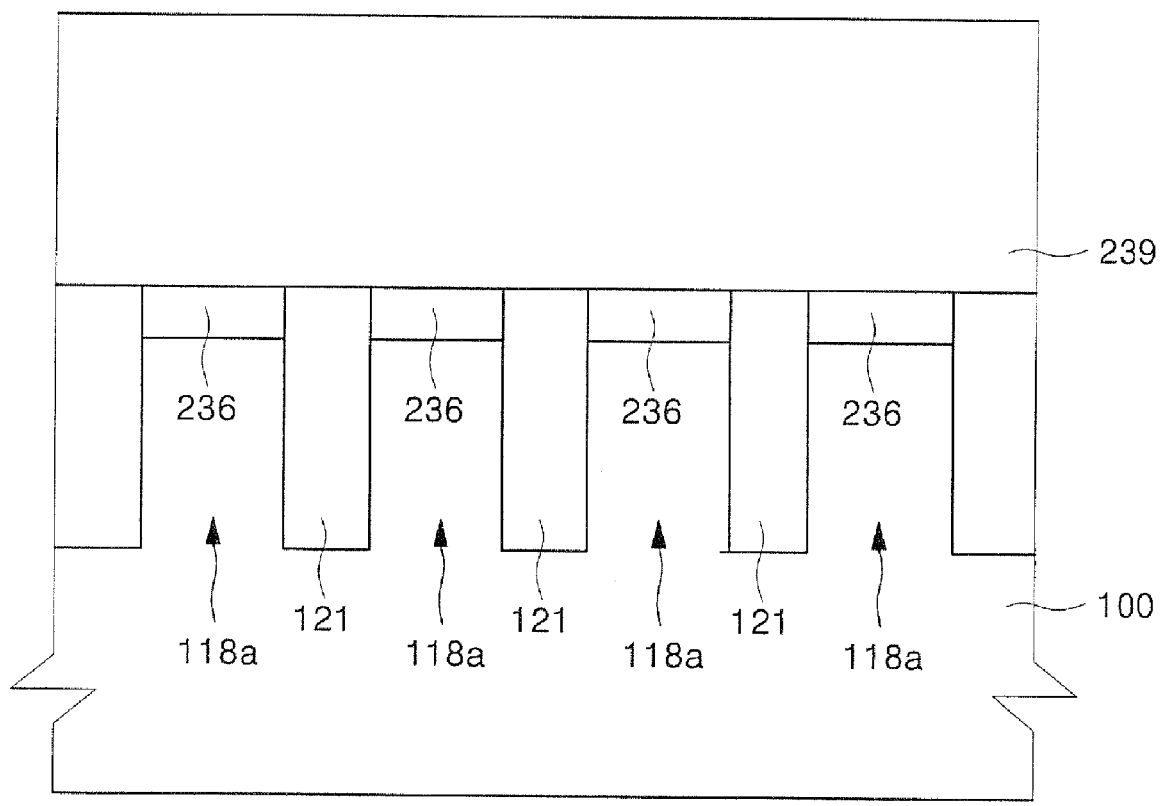
FIGS. 15A, 16A, 17A, 18A, 19A and 20A are cross-sectional views taken along line I-I' of FIG. 1, illustrating an exemplary method of fabricating a semiconductor device according to a second embodiment.
Figure 15B:
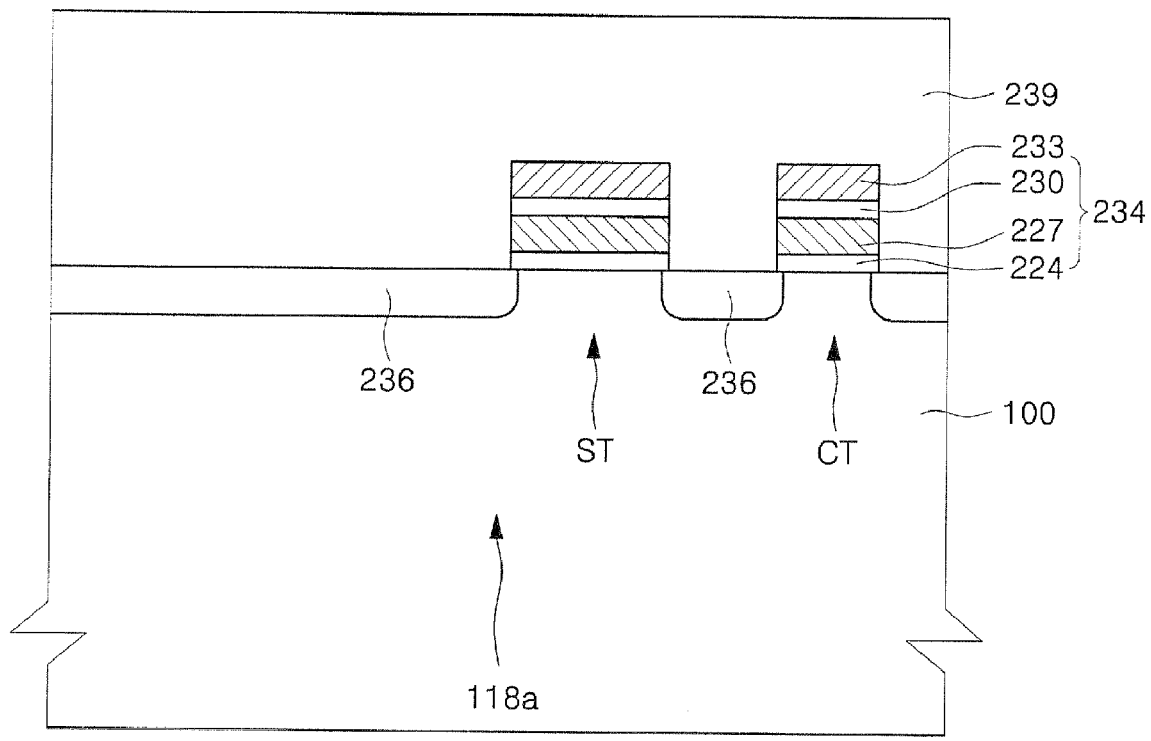
FIGS. 15B, 16B, 17B, 18B, 19B and 20B are cross-sectional views taken along line II-II' of FIG. 1, illustrating an exemplary method of fabricating a semiconductor device according to the second embodiment.

Referring to FIGS. 1, 15A and 15B, a semiconductor substrate 100 having active regions 118a defined by the isolation layer 121 may be formed according to, for example, the same method as described above with respect to FIGS. 2A through 7A and 2B through 7B.

Transistors may be formed on each of the active regions 118a. The transistors may include gate structures 234 formed on each of the active regions 118a, and impurity regions 236 formed in each of the active regions at both sides of the gate structure 234. At least one of the transistors may be a cell transistor CT and at least one of the transistors may be a selection transistor ST. A gate electrode of the cell transistor CT may serve as a word line WL and extend to cross above the active regions 118a. A gate electrode of the selection transistor ST may serve as a string selection line SSL or ground selection line GSL and extend to cross above the active regions 118a.

In one embodiment, the gate structure 234 of the cell transistor CT may include a gate dielectric layer 224, a floating gate 227, an inter-gate dielectric layer 230 and a control gate 233, which are sequentially stacked. The floating gate 227 may, for example, include poly-silicon. The impurity regions 236 may be source/drain regions.

In another embodiment, the gate structure 234 of the cell transistor CT may include a first dielectric layer, a data storage layer, a second dielectric layer and a gate electrode, which are sequentially stacked.

An interlayer dielectric layer 239 may be formed on the semiconductor substrate 100 having the transistors ST and CT. The interlayer dielectric layer 239 may include, for example, silicon oxide.

Figure 16A:
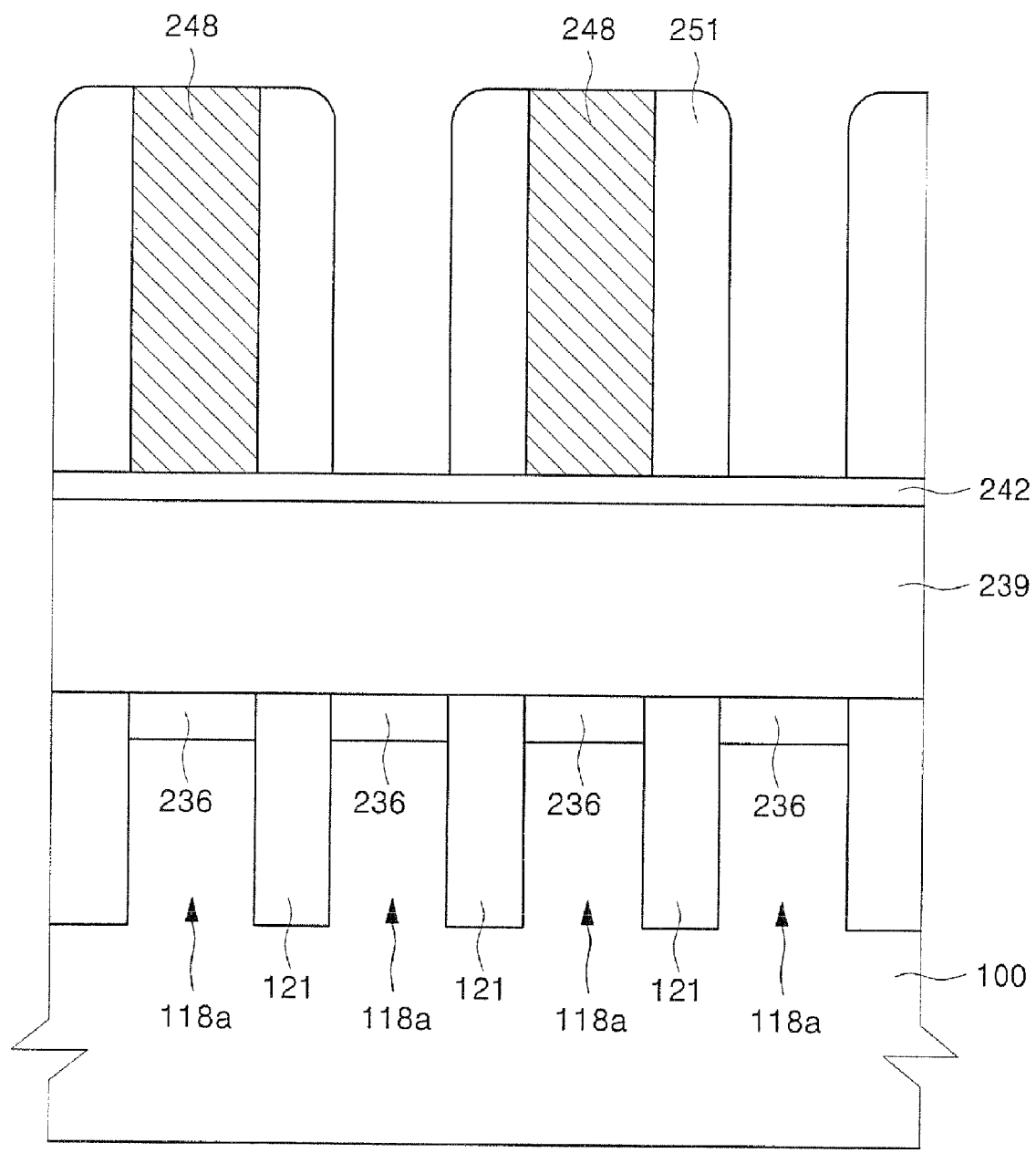
Figure 16B:
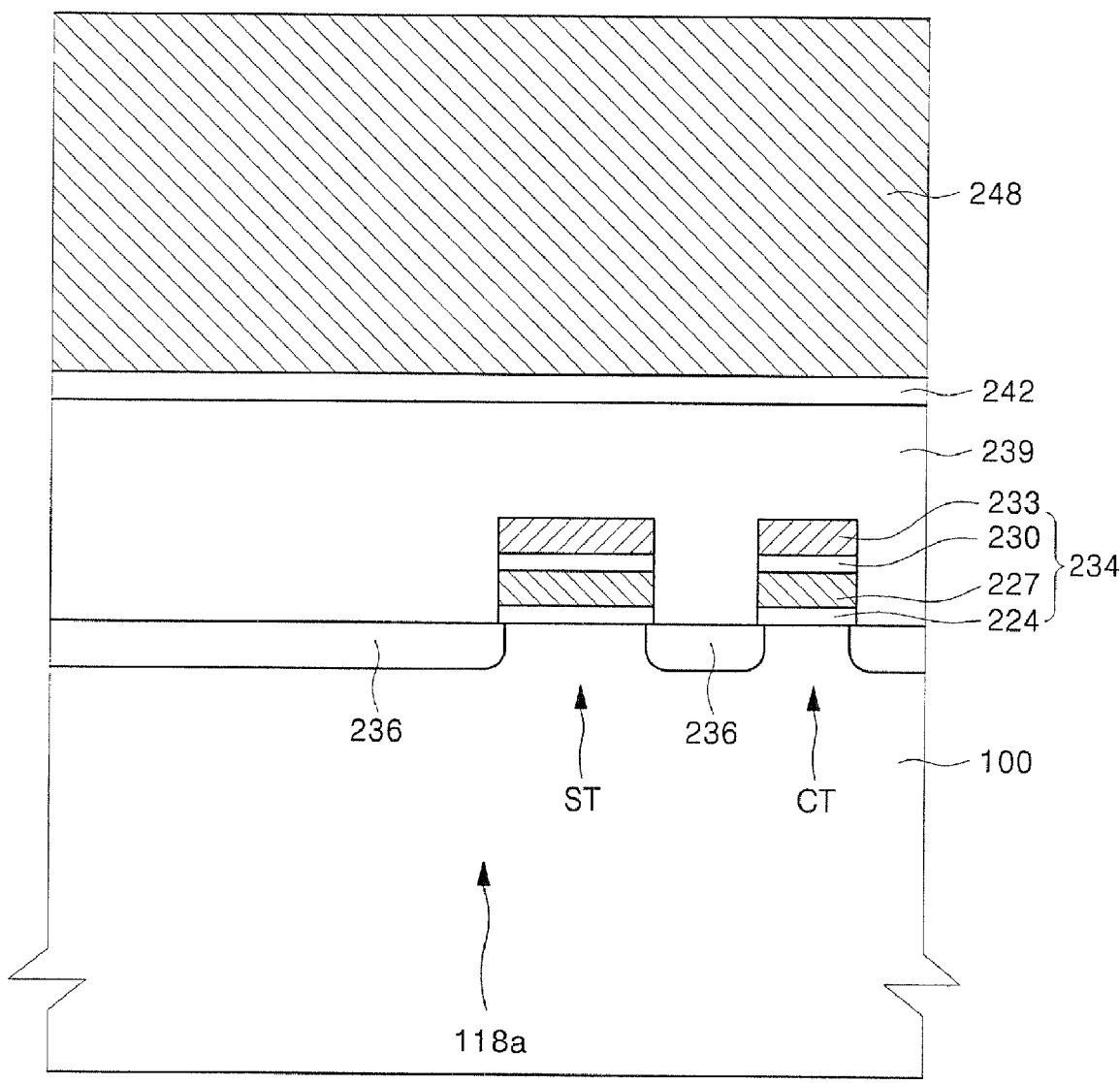

Referring to FIGS. 1, 16A and 16B, an etch stop layer 242 may be formed on the interlayer dielectric layer 239. The etch stop layer 242 may include a material layer having an etch selectivity with respect to the interlayer dielectric layer 239. For example, when the interlayer dielectric layer 239 includes silicon oxide, the etch stop layer 242 may include a material such as silicon nitride.

A first molding layer may be formed on the etch stop layer 242. The first molding layer may include a material having an etch selectivity with respect to the etch stop layer 242. For example, when the etch stop layer 242 includes silicon nitride, the first molding layer may include a material such as poly-silicon. Subsequently, the first molding layer may be patterned to form first molding lines 248 having a line shape. Photolithography and etching processes may be used to pattern the first molding layer such that the first molding lines 248 have a substantially uniform width.

In one embodiment, each of the first molding lines 248 may be formed to overlap odd-numbered or even-numbered active regions in the active regions 118a.

A spacer layer 251 may be formed to cover the sidewalls of the first molding lines 248. The spacer layer 251 may be formed by conformally forming a material layer having an etch selectivity with respect to the first molding lines 248 on the semiconductor substrate 100 and over the first molding lines 248 followed by anisotropically etching the material layer such that the spacer layer 251 has a substantially uniform width on the sidewalls of the first molding lines 248.

Figure 17A:
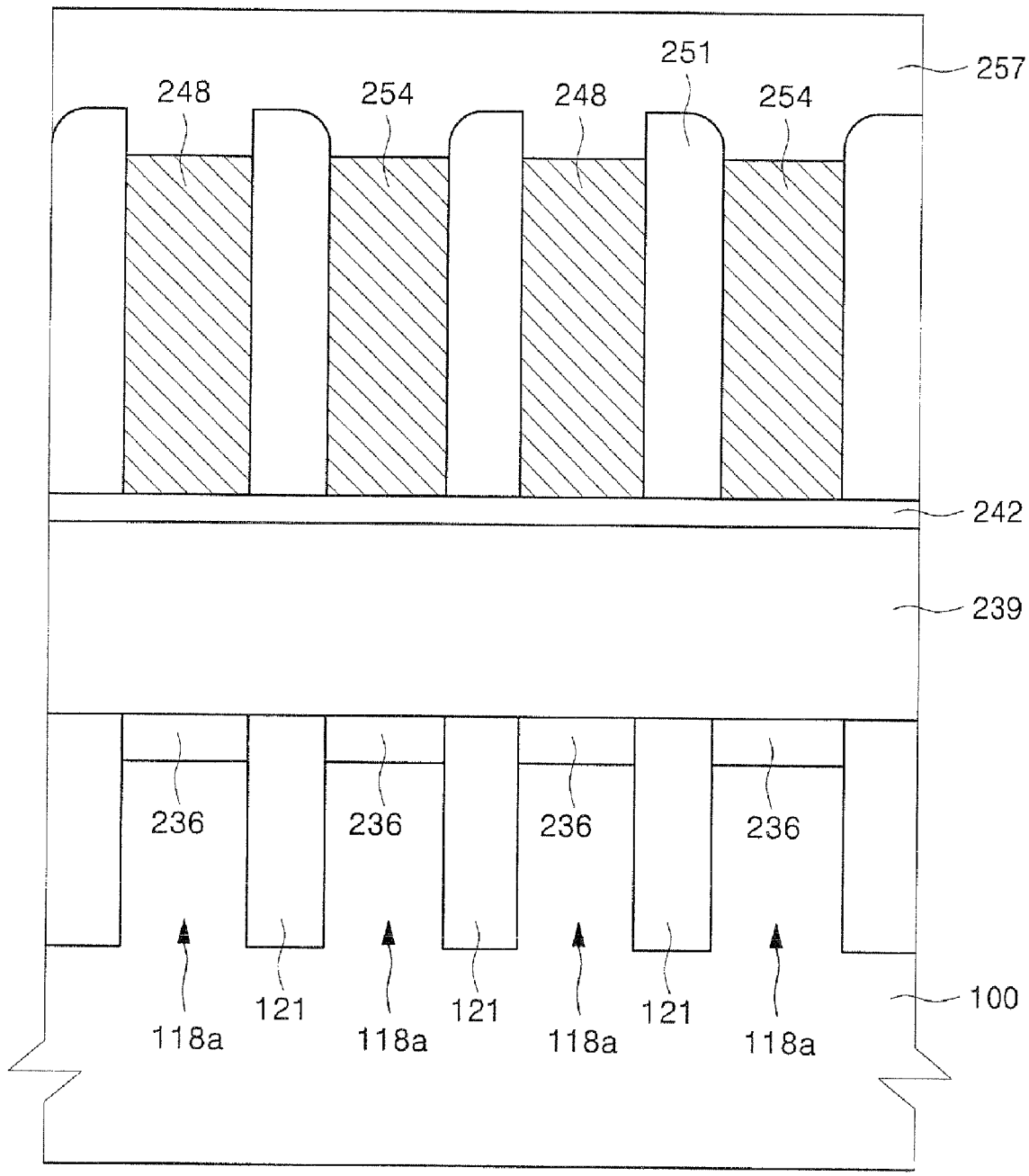
Figure 17B:
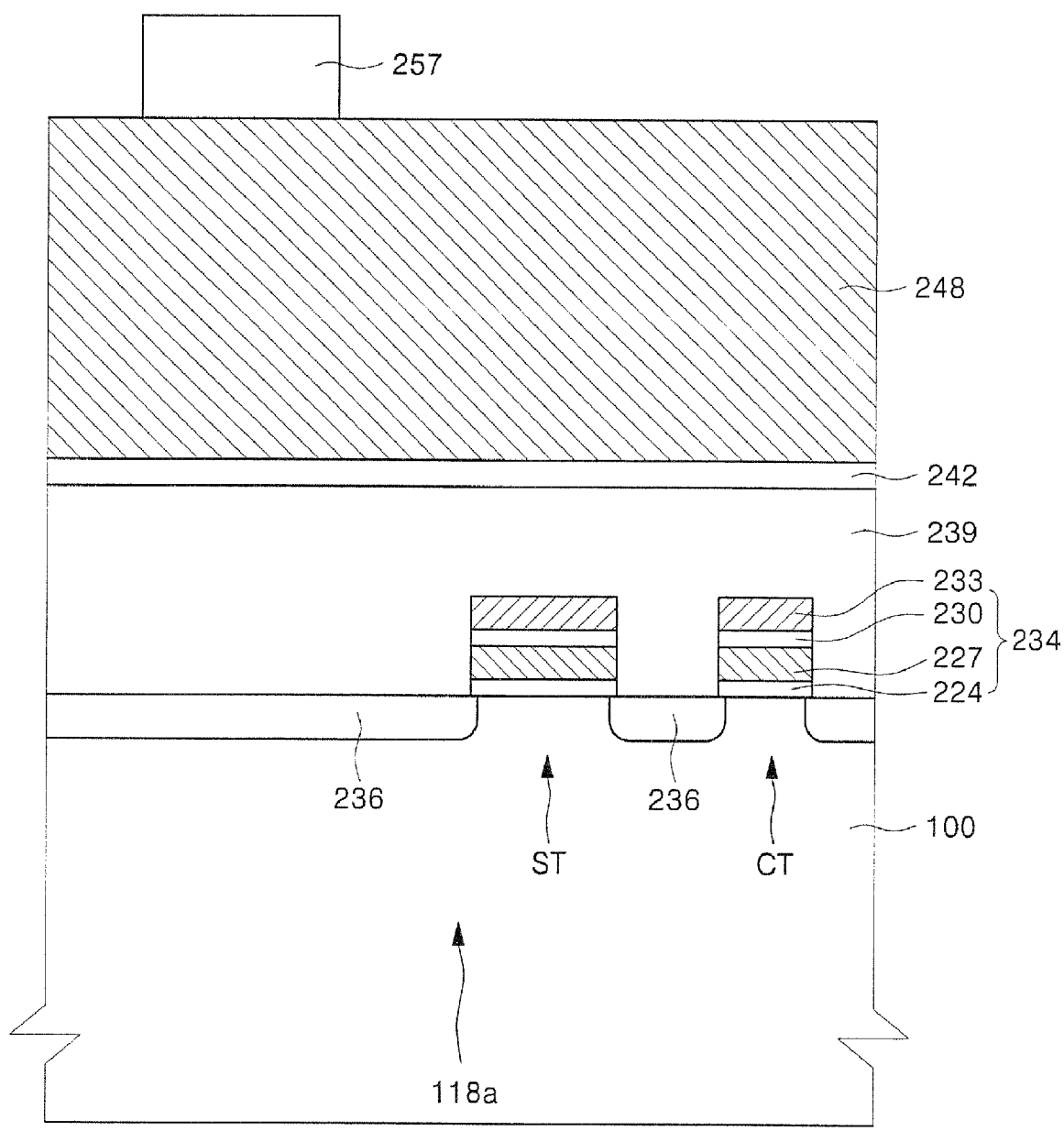

Referring to FIGS. 1, 17A and 17B, a second molding layer may be formed on the semiconductor substrate 100 having the spacer layer 251. The second molding layer may include substantially the same material as the first molding layer. Subsequently, the second molding layer is patterned (e.g., planarized) to form second molding lines 254 having a substantially uniform width between the first molding lines 248. The second molding lines 254 may also have a line shape.

The second molding layer may be planarized using an etchback and/or CMP technique. When planarizing the second molding layer using an etchback technique, the second molding layer may be etched such that top surfaces of the second molding lines 254 are substantially coplanar with top surface of the first molding lines 248. In one embodiment, the second molding layer may be over-etched such that top surfaces of the second molding lines 254 are lower than top surfaces of the spacer layer 251. Because the first and second molding lines 248 include substantially the same material, the first molding lines 248 are simultaneously etched while the second molding layer is over-etched. Thus, the top surfaces of the first and second molding lines 248 may be substantially coplanar.

When the second molding layer is planarized using a CMP technique, top surfaces of the second molding lines 254 may be substantially coplanar with top surfaces of the first molding lines 248 and the spacer layer 251. Thus, the second molding lines 254 may be positioned at substantially the same level as the first molding lines 248. When each of the first molding lines 248 is formed to overlap the odd-numbered active regions, each of the second molding lines 254 may be formed to overlap the even-numbered active regions.

A line-shaped photoresist pattern 257 crossing over the first and second molding lines 248 and 254 may be formed on the semiconductor substrate 100 having the second molding lines 254. The photoresist pattern 257 may be formed to have a substantially uniform, predetermined width.

In one embodiment, the photoresist pattern 257 may be formed to cross over portions of active regions 118a such that the string selection line SSL of the selection transistor ST is horizontally between the photoresist pattern 257 and the word line WL of the cell transistor CT. The photoresist pattern 257 may be substantially parallel with the string selection line SSL.

Figure 18A:
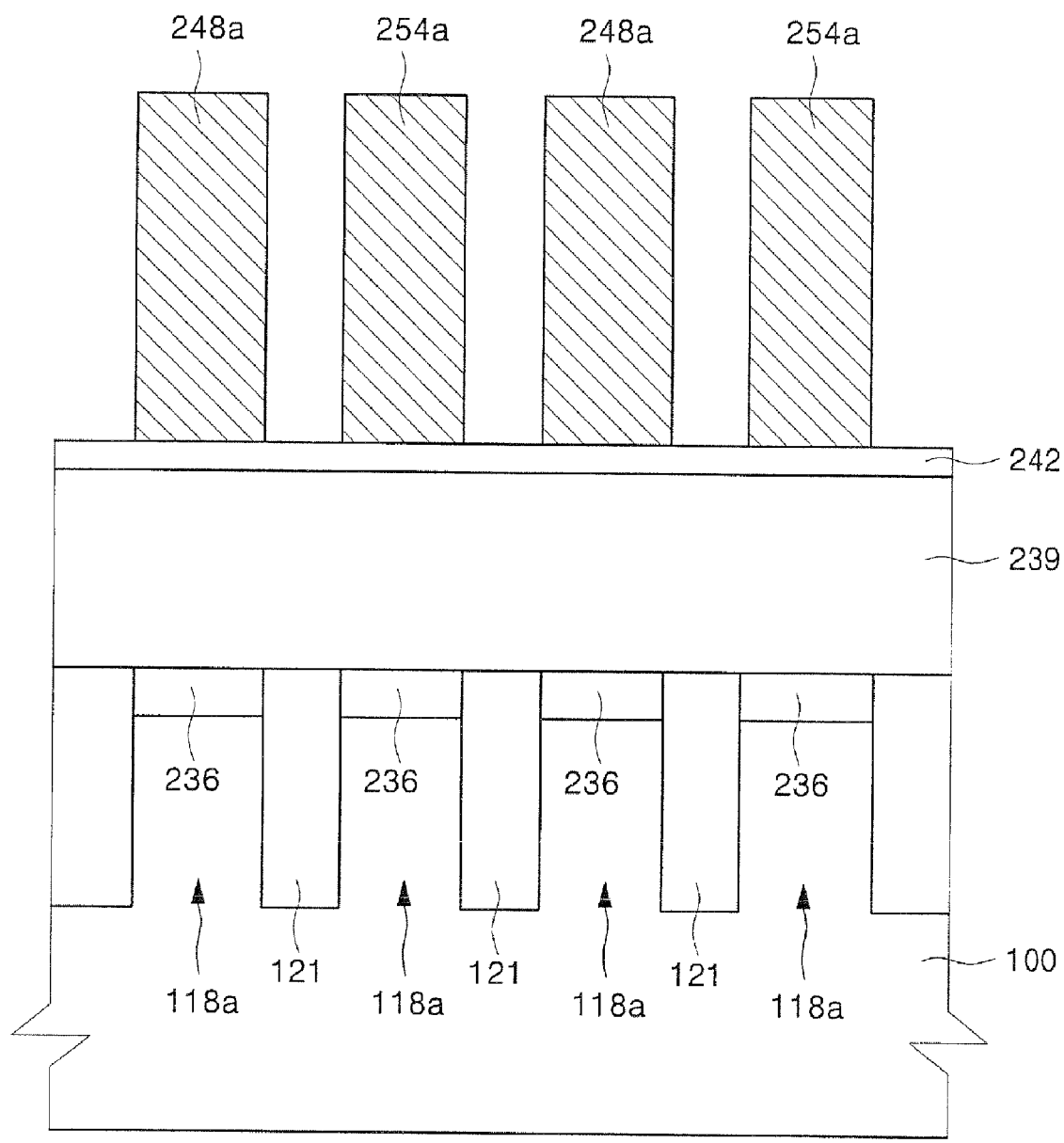
Figure 18B:
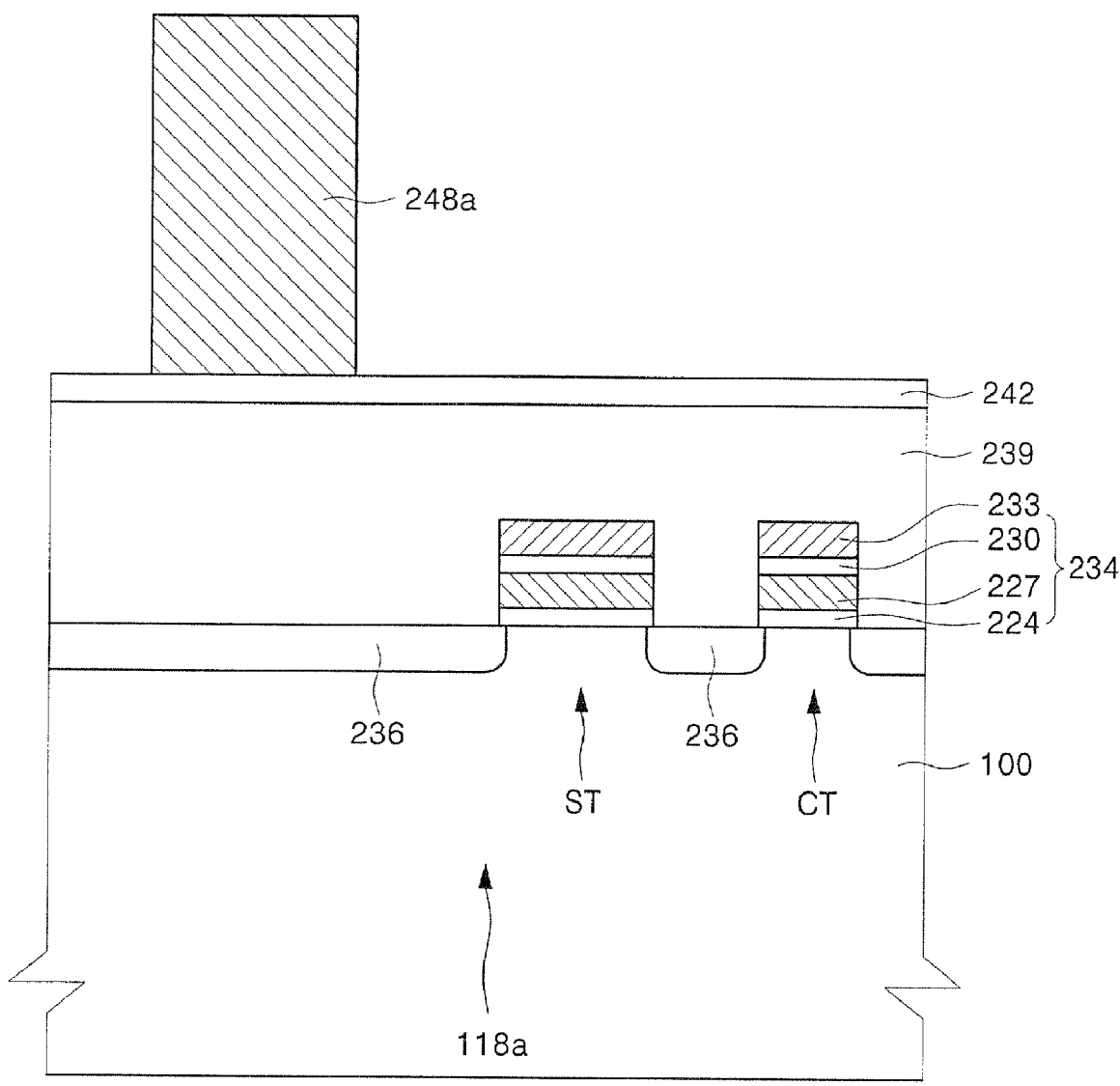

Referring to FIGS. 1, 18A and 18B, first and second opening molding patterns 248a and 254a may be formed by etching the first and second molding lines 248 and 254 using the photoresist pattern 257 as an etching mask. The photoresist pattern 257 may then be removed. Subsequently, the spacer layer 251 may be removed (e.g., etched). As a result, the first and second molding patterns 248a and 254a may remain on the etch stop layer 242.

According to one embodiment, because the line-shaped first and second molding lines 248 and 254 are patterned using the photoresist pattern 257 having the predetermined width, each of the first and second opening molding patterns 248a and 254a may be formed to have a substantially uniform width. Moreover, each of the first and second opening molding patterns 248a and 254a may be formed to have major and minor axes. The major axes of the first and second opening molding patterns 248a and 254a may extend along substantially the same direction as the longitudinal direction of the active regions 118a. Accordingly, the first and second molding patterns 248a and 254a may be formed by adjusting the widths of the first and second molding lines 248 and 254 as well as the width of the photoresist pattern 257.

Figure 19A:
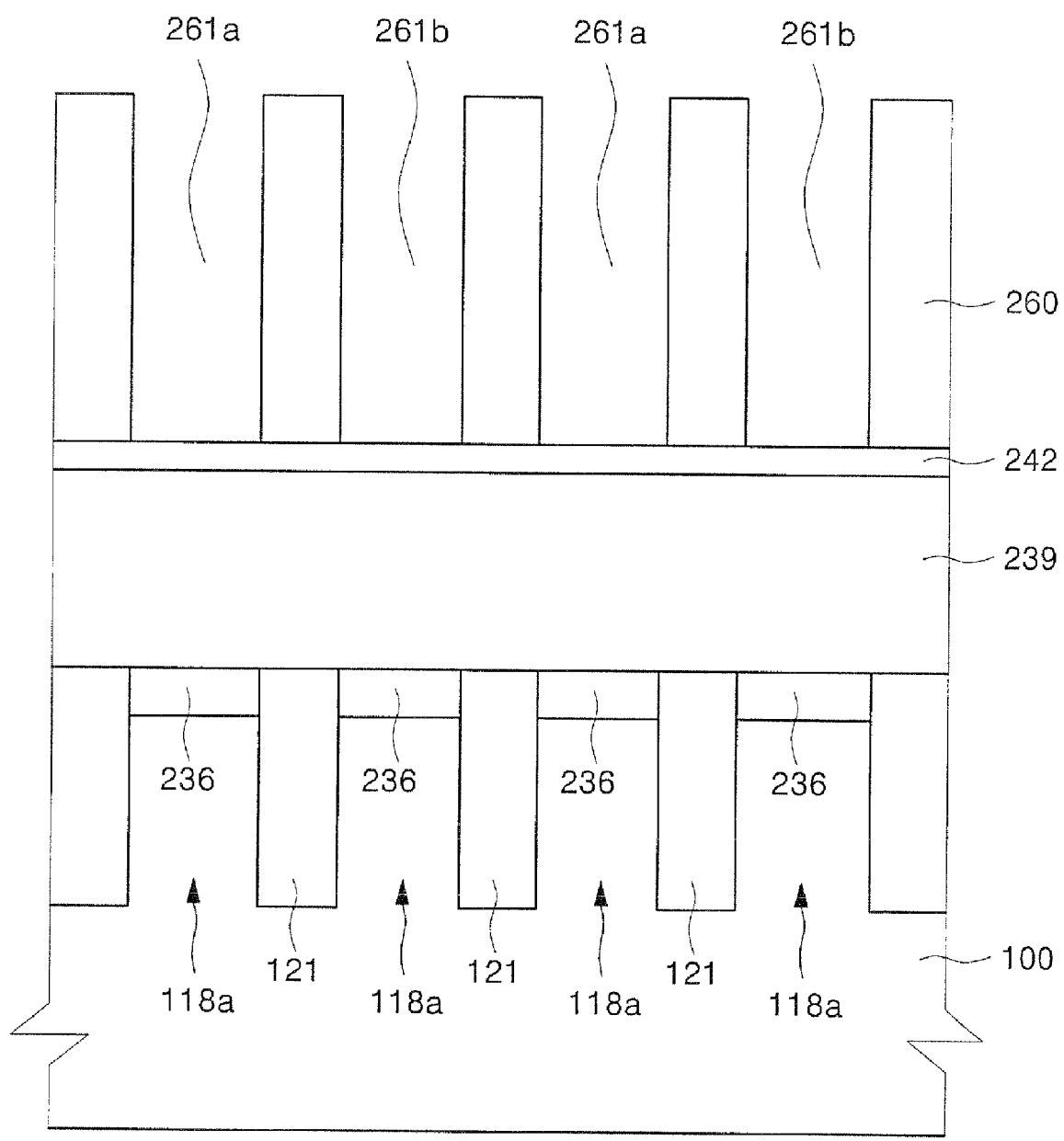
Figure 19B:
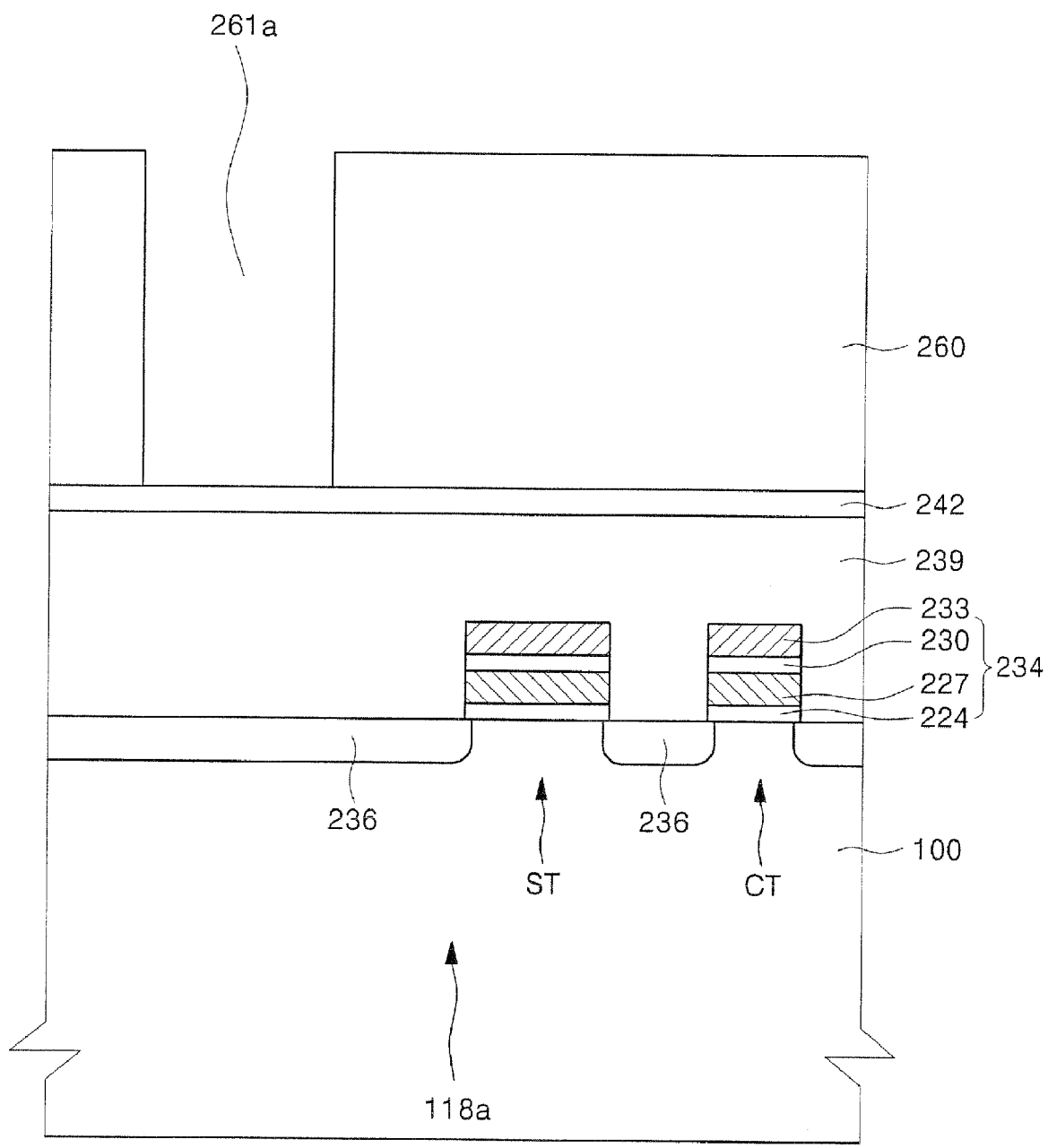

Referring to FIGS. 1, 19A and 19B, a mask layer may be formed on the semiconductor substrate 100 having the first and second opening molding patterns 248a and 254a. The mask layer may include a material having an etch selectivity with respect to the first and second opening molding patterns 248a and 254a. For example, the mask layer may include an organic material such as a photoresist, an ARC, an amorphous carbon material, or the like or a combination thereof. Subsequently, the mask layer may be patterned (e.g., planarized) to form a mask pattern 260. In one embodiment, the mask layer may be planarized using an etchback process until the top surfaces of the first and second opening molding patterns 248a and 254a are exposed.

Thereafter, the first and second opening molding patterns 248a and 254a may be removed to form first and second openings 261a and 261b within the mask pattern 260. As a result, the first and second openings 261a and 261b may extend along a direction substantially parallel with the string selection line SSL.

Figure 20A:
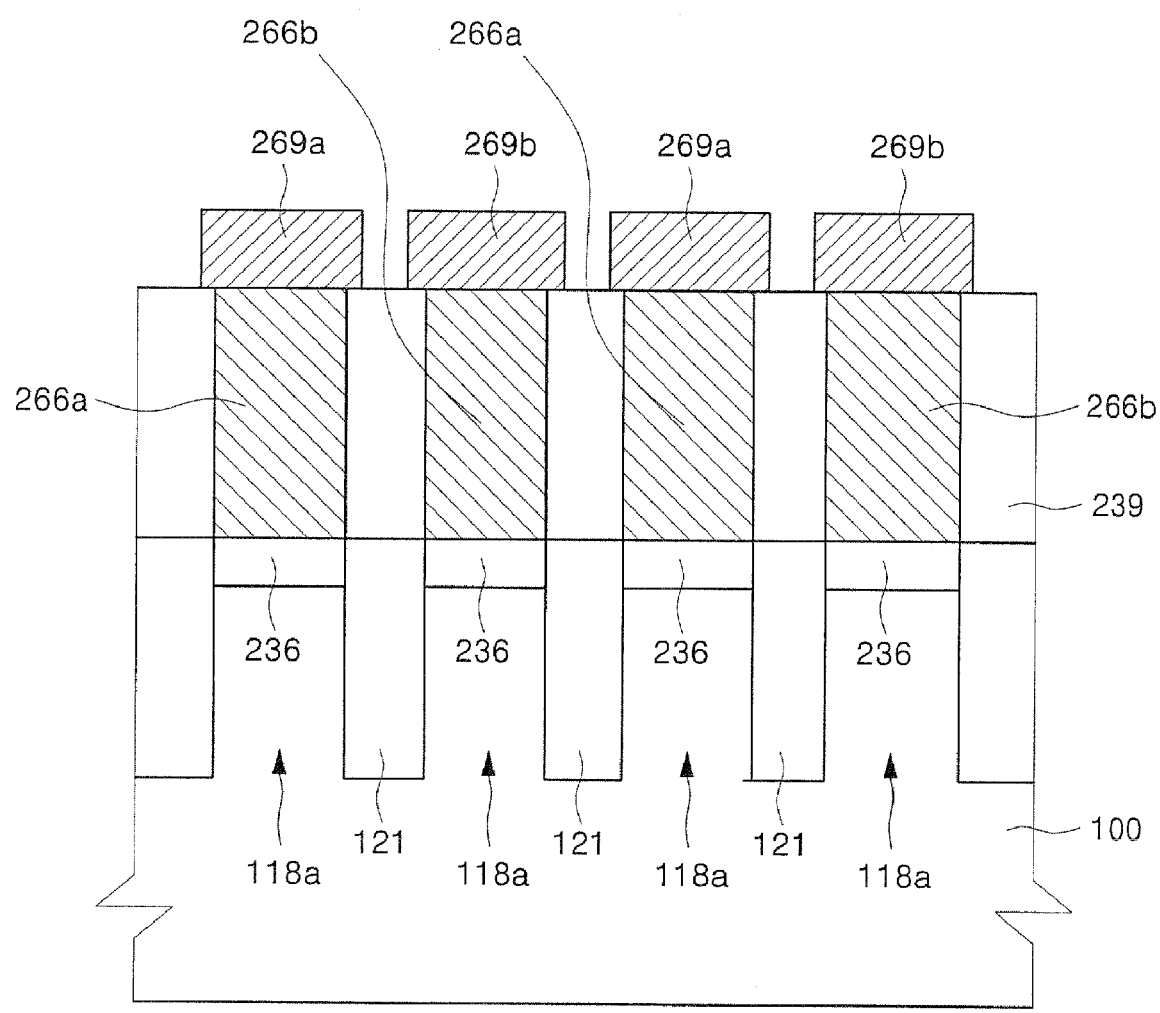
Figure 20B:
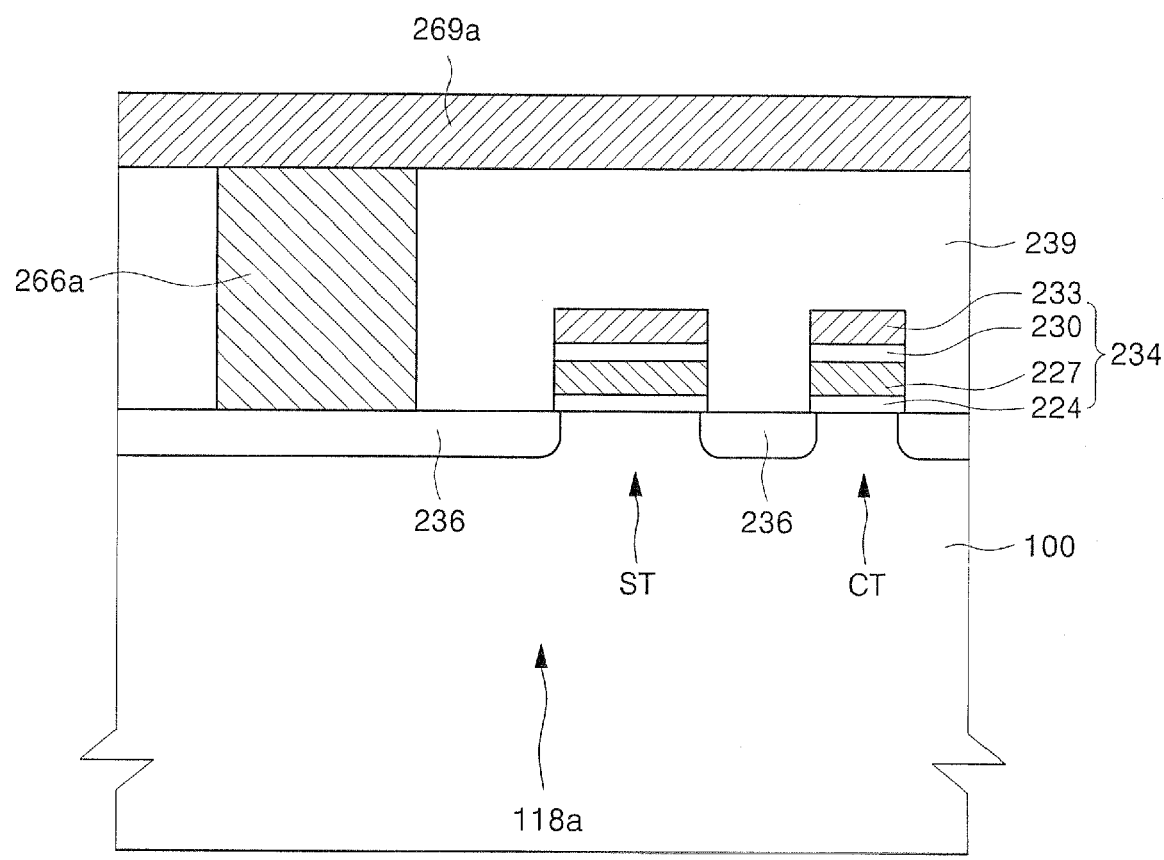

Referring to FIGS. 1, 20A and 20B, first and second contact holes exposing the active regions 118a adjacent to the string selection line SSL may be formed by etching the etch stop layer 242 and the interlayer dielectric layer 239 using the mask pattern 260 as an etching mask (e.g., as described in FIGS. 13A and 13B). Subsequently, the mask pattern 260 may be removed. Thereafter, the etch stop layer 242 may be removed. Contact plugs CN may be formed by filling the first and second contact holes (e.g., as described in FIGS. 14A and 14B). The contact plugs CN may include first and second contact plugs 266a and 266b respectively filling the first and second contact holes. Thereafter, first conductive lines 269a overlapping the first contact plugs 266a may be formed on the interlayer dielectric layer 239 (e.g., as described in FIGS. 15A and 15B). Second conductive lines 269b overlapping the second contact plugs 266b may be formed between the first conductive lines 269a. The first and second conductive lines 269a and 269b may be referred to as bit lines BL. Each of the first conductive lines 269a may be formed to overlap odd-numbered or even-numbered active regions in the active regions 118a. Each of the second conductive lines 269b may be formed to overlap active regions 118a located horizontally between the first conductive lines 269a.

According to the embodiments exemplary described above, first and second molding patterns may be formed by patterning first and second molding lines having a line shape. Openings of a mask pattern formed along the first and second molding patterns may have a substantially uniform size. Accordingly, subsequently-formed contact holes are formed to have a substantially uniform size and contact plugs filling the contact holes have a substantially uniform resistance. As a result, the reliability of a semiconductor device formed as described above can be enhanced.

Thus, in accordance with one embodiment exemplary described herein, a method of fabricating a semiconductor device may, for example, include forming an isolation layer defining active regions on a semiconductor substrate. An interlayer dielectric layer may be formed on the semiconductor substrate having the isolation layer. First molding patterns may be formed on the interlayer dielectric layer. Second molding patterns positioned between the first molding patterns and spaced apart therefrom may also be formed. A mask pattern surrounding sidewalls of the first and second molding patterns may be formed. Openings may be formed by removing the first and second molding patterns. Contact holes are formed by etching the interlayer dielectric layer using the mask pattern as an etching mask.

In one embodiment, the first molding patterns and the second molding patterns may be formed by forming first molding lines on the interlayer dielectric layer, forming second molding lines on the interlayer dielectric layer, the second molding lines positioned between the first molding lines and spaced apart from the first molding lines, patterning the first molding lines to form first molding patterns; and patterning the second molding lines to form second molding patterns.

In one embodiment, at least a portion of the first and second molding lines may be substantially coplanar with one another.

In one embodiment, the first and second molding patterns may be formed to have the same size as each other.

In one embodiment, of the first and second molding patterns may be formed to have major and minor axes as view from a plan view. In one embodiment, the major axes of the first and second molding patterns may have the same direction as a longitudinal direction of the first and second molding lines.

In one embodiment, a buffer layer on the semiconductor substrate before forming the first molding lines. In another embodiment, recessed region may be formed by partially etching the buffer layer positioned at both sides of the first molding lines, after forming the first molding lines.

In one embodiment, the second molding lines may be formed by forming a conformal spacer layer covering the first molding lines and the buffer layer having the recessed region, forming a molding layer on the semiconductor substrate having the spacer layer, and planarizing the molding layer such that top surfaces of the second molding lines are positioned at the same level as those of the first molding lines.

In one embodiment, the first and second molding patterns may be formed by forming photoresist pattern intersecting the first and second molding lines on the spacer layer and the second molding lines, forming the first and second molding patterns by etching the spacer layer and the first and second molding lines using the photoresist pattern as an etching mask, removing the photoresist pattern, and etching the spacer layer and the buffer layer around the first and second molding patterns using the first and second molding patterns as etching masks.

In one embodiment, the second molding lines may be formed by forming a spacer layer covering the first molding lines on the semiconductor substrate having the first molding lines, forming a molding layer on the semiconductor substrate having the spacer layer, and planarizing the molding layer such that the molding layer remains between the first molding lines.

In one embodiment, the first and second molding patterns may be formed by forming a photoresist pattern intersecting the first and second molding lines on the semiconductor substrate having the second molding lines, forming the first and second molding patterns by etching the first and second molding lines using the photoresist pattern as an etching mask, removing the photoresist pattern, and etching the spacer layer such that the sidewalls of the first and second molding patterns are exposed.

In one embodiment, a plurality of active regions may be spaced apart from one another by the isolation layer and each of the active regions may be defined by the isolation layer to have a line shape.

In one embodiment, each of the first molding lines may be formed to overlap with odd-numbered or even numbered active regions in the active regions, and each of the second molding lines may be formed to overlap with active regions positioned between the first molding lines in the active regions.

In one embodiment, the defining of the active regions may include forming first hard mask patterns on the semiconductor substrate, forming second hard mask patterns between the first hard mask patterns, forming trenches by etching the semiconductor substrate positioned between the first and second hard mask patterns, forming the isolation layer filling the trenches, and removing the first and second hard mask patterns.

In one embodiment, the defining of the active regions may include forming a buffer layer on the semiconductor substrate, forming a first hard mask patterns on the buffer layer, forming a recessed region by partially etching the buffer layer around the first hard mask patterns, forming a conformal sacrificial layer covering the first hard mask patterns and the buffer layer having the recessed region, forming second hard mask patterns respectively surrounded by the sacrificial layer between the first hard mask patterns, forming sacrificial patterns remaining beneath the second hard mask patterns by etching the sacrificial layer positioned on the first hard mask patterns and between the first and second hard mask patterns, forming trenches by etching the exposed semiconductor substrate using the first and second hard mask patterns as an etching mask, forming the isolation layer filling the trenches, and removing the first and second hard mask patterns and removing the sacrificial patterns.

In one embodiment, the defining of the active regions may include forming first hard mask patterns on the semiconductor substrate, forming a sacrificial layer covering sidewalls of the first hard mask patterns, forming second hard mask patterns positioned between the first hard mask patterns and having both sidewalls coming into contact with the sacrificial layer, removing the sacrificial layer, forming trenches by etching the semiconductor substrate using the first and second hard mask patterns as an etching mask, forming the isolation layer filling the trenches, and removing the hard mask patterns.

In one embodiment, gate structures may be formed on the active regions before forming the interlayer dielectric layer and impurity regions may be formed in the active regions at both sides of the gate structures.

In one embodiment, each of the gate structures may include a first dielectric layer, a data storage layer, a second dielectric layer and a gate electrode, which are sequentially stacked. In another embodiment, each of the gate structures may include a gate dielectric layer, a floating gate, a dielectric layer between gates, and a control gate, which are sequentially stacked.

In one embodiment, the mask pattern may be formed of an organic material layer.

In one embodiment, the method may further include removing the mask pattern and forming contact plugs filling the contact holes.

The subject matter disclosed herein is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of fabricating a semiconductor device, comprising:
    forming an isolation layer on a semiconductor substrate, the isolation layer defining active regions within the semiconductor substrate;
    forming an interlayer dielectric layer on the semiconductor substrate;
    forming first molding patterns on the interlayer dielectric layer;
    forming second molding patterns on the interlayer dielectric layer, the second molding patterns positioned between the first molding patterns and spaced apart from the first molding patterns;
    forming a mask pattern surrounding sidewalls of the first molding patterns and sidewalls of the second molding patterns;
    removing the first molding patterns and the second molding patterns to form openings within the mask pattern; and
    forming contact holes by etching the interlayer dielectric layer using the mask pattern as an etching mask.

2. The method according to claim 1, wherein forming the first molding patterns and the second molding patterns comprises:
    forming first molding lines on the interlayer dielectric layer;
    forming second molding lines on the interlayer dielectric layer, the second molding lines positioned between the first molding lines and spaced apart from the first molding lines;
    patterning the first molding lines to form first molding patterns; and
    patterning the second molding lines to form second molding patterns.

3. The method according to claim 2, wherein at least a portion of one of the first molding lines is substantially coplanar with at least a portion of one of the second molding lines.

4. The method according to claim 1, wherein a width of one of the first molding patterns is substantially the same as a width of one of the second molding patterns.

5. The method according to claim 1, wherein at least one of the first molding patterns and at least one of the second molding patterns has a major axis and a minor axis when viewed in plan view.

6. The method according to claim 5, wherein the active regions extend along a longitudinal direction across the semiconductor substrate and the major axis of the at least one of the first molding patterns and the major axis of the at least one of the second molding patterns extend along substantially the same direction as the longitudinal direction.

7. The method according to claim 2, further comprising, before forming the first molding lines, forming a buffer layer on the interlayer dielectric layer.

8. The method according to claim 7, further comprising:
forming the first molding lines over the buffer layer such that portions of the buffer layer are adjacent to opposite sides of at least one of the first molding lines; and
after forming the first molding lines, forming a recessed region within each portion of the buffer layer adjacent to the opposite sides of the at least one of the first molding lines.

9. The method according to claim 8, wherein forming the second molding lines comprises:
forming a spacer layer conformally over the first molding lines and within each recessed region;
forming a molding layer on the spacer layer; and
patterning the molding layer such that a top surface of at least one of the second molding lines is substantially coplanar with a top surface of at least one of the first molding lines.

10. The method according to claim 9, wherein forming the first molding patterns and the second molding patterns comprises:
forming a photoresist pattern on the spacer layer and the second molding lines, the photoresist pattern crossing over the first molding lines and the second molding lines;
etching portions of the spacer layer above the first molding lines using the photoresist pattern as an etching mask;
etching portions of the first molding lines and portions of the second molding lines using the photoresist pattern as an etching mask;
removing the photoresist pattern;
etching portions of the spacer layer remaining between the first molding lines and the second molding lines using the first molding patterns and the second molding patterns as etching masks; and
etching portions of the buffer layer exposed within the recessed regions using the first molding patterns and the second molding patterns as etching masks.

11. The method according to claim 2, wherein the forming the second molding lines comprises:
forming a spacer layer over the first molding lines;
forming a molding layer on the spacer layer; and
patterning the molding layer such that a portion of the molding layer remains between pairs of adjacent ones of the first molding lines.

12. The method according to claim 11, wherein forming the first molding patterns and the second molding patterns comprises:
forming a photoresist pattern on the spacer layer and the second molding lines, the photoresist pattern crossing over the first molding lines and the second molding lines;
etching portions of the first molding lines and the second molding lines using the photoresist pattern as an etching mask;
removing the photoresist pattern; and
etching portions of the spacer layer such that sidewalls of the first molding lines and the second molding lines are exposed.

13. The method according to claim 1, wherein the active regions are spaced apart from one another by the isolation layer and wherein the isolation layer defines each of the active regions to have a line shape.

14. The method according to claim 1, wherein each of the first molding patterns overlaps a first plurality of active regions and wherein each of the second molding patterns overlaps a second plurality of active regions, wherein an active region of the second plurality of active regions is laterally between active regions of the first plurality of active regions.

15. The method according to claim 1, wherein forming the isolation layer comprises:
forming first hard mask patterns on the semiconductor substrate;
forming second hard mask patterns between the first hard mask patterns, the second hard mask patterns being spaced apart from the first hard mask patterns;
etching portions of the semiconductor substrate positioned between the first hard mask patterns and the second hard mask patterns, using the first hard mask patterns and the second hard mask patterns as an etching mask, to form trenches;
filling the trenches with an insulating material; and
removing the first hard mask patterns and the second hard mask patterns.

16. The method according to claim 1, wherein forming the isolation layer comprises:
forming a buffer layer on the semiconductor substrate;
forming first hard mask patterns on the buffer layer such that portions of the first hard mask layer are adjacent to opposite sides of at least one of the first hard mask patterns;
after forming the first hard mask patterns, forming a recessed region within each portion of the buffer layer adjacent to the opposite sides of the at least one of the first hard mask patterns;
forming a sacrificial layer covering sidewalls of the first hard mask patterns and disposed within each recessed region;
forming second hard mask patterns over the sacrificial layer and between the first hard mask patterns;
etching portions of the sacrificial layer over the first hard mask patterns;
etching portions of the sacrificial layer between the first hard mask patterns and the second hard mask patterns, thereby forming sacrificial patterns beneath the second hard mask patterns;
etching portions of the semiconductor substrate positioned between the first hard mask patterns and the second hard mask patterns using the first hard mask patterns and the second hard mask patterns as an etching mask to form trenches;
filling the trenches with an insulating material;
removing the first hard mask patterns and the second hard mask patterns; and
removing the sacrificial hard mask patterns.

17. The method according to claim 1, wherein forming the isolation layer comprises:
forming first hard mask patterns on the semiconductor substrate;
forming a sacrificial layer covering sidewalls of the first hard mask patterns;
forming second hard mask patterns between the first hard mask patterns, wherein sidewalls of each of the second hard mask patterns contact the sacrificial layer;
removing the sacrificial layer;
etching portions of the semiconductor substrate positioned between the first hard mask patterns and the second hard mask patterns, using the first hard mask patterns and the second hard mask patterns as an etching mask, to form trenches;
filling the trenches with an insulating material; and
removing the first hard mask patterns and the second hard mask patterns.

18. The method according to claim 1, further comprising, before forming the interlayer dielectric layer:
　forming gate structures on the active regions; and
　forming impurity regions in the active regions at opposite sides of the gate structures.

19. The method according to claim 18, wherein at least one of the gate structures comprises a first dielectric layer, a data storage layer, a second dielectric layer and a gate electrode.

20. The method according to claim 18, wherein at least one of the gate structures comprises a gate dielectric layer, a floating gate, an inter-gate dielectric layer, and a control gate.

21. The method according to claim 1, wherein the mask pattern includes an organic material.

22. The method according to claim 1, further comprising:
　removing the mask pattern; and
　forming contact plugs filling the contact holes.

23. The method according to claim 2, further comprising forming the second molding lines after forming the first molding lines.

\* \* \* \* \*

UNITED STATES PATENT AND TRADEMARK OFFICE
CERTIFICATE OF CORRECTION

PATENT NO.       : 7,521,348 B2  
APPLICATION NO.  : 11/871877  
DATED            : April 21, 2009  
INVENTOR(S)      : Sung-Hyun Kwon et al.

Page 1 of 1

It is certified that error appears in the above-identified patent and that said Letters Patent is hereby corrected as shown below:

Column 5, line 64, the words "15 1a" should read -- 151a --.

Signed and Sealed this

Fifteenth Day of September, 2009

David J. Kappos  
*Director of the United States Patent and Trademark Office*